United States Patent
Ito et al.

(10) Patent No.: US 8,737,155 B2
(45) Date of Patent: May 27, 2014

(54) POWER SAVING MEMORY APPARATUS, SYSTEMS, AND METHODS

(75) Inventors: Yutaka Ito, Tokyo (JP); Masayoshi Nomura, Ibaraki (JP); Keiichiro Abe, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/213,949

(22) Filed: Aug. 19, 2011

(65) Prior Publication Data

US 2011/0299353 A1    Dec. 8, 2011

Related U.S. Application Data

(63) Continuation of application No. 11/754,756, filed on May 29, 2007, now Pat. No. 8,004,920.

(51) Int. Cl.
    *G11C 5/14* (2006.01)
(52) U.S. Cl.
    USPC .......................... 365/229; 365/222; 365/227
(58) Field of Classification Search
    USPC .............................. 365/222, 189.09, 226–229
    See application file for complete search history.

(56) References Cited

U.S. PATENT DOCUMENTS

| | | | |
|---|---|---|---|
| 5,365,487 A | 11/1994 | Patel et al. | |
| 5,654,913 A | 8/1997 | Fukushima et al. | |
| 5,798,976 A | 8/1998 | Arimoto | |
| 5,805,508 A | 9/1998 | Tobita | |
| 5,953,246 A | 9/1999 | Takashima et al. | |
| 5,999,466 A * | 12/1999 | Marr et al. | 365/201 |
| 6,038,186 A | 3/2000 | Tanizaki | |
| 6,246,625 B1 | 6/2001 | Yamagata et al. | |
| 6,813,216 B2 | 11/2004 | Lee | |
| 6,845,054 B2 | 1/2005 | Lovett et al. | |
| 6,990,031 B2 | 1/2006 | Hashimoto et al. | |
| 6,992,946 B2 | 1/2006 | Ooishi | |
| 8,004,920 B2 | 8/2011 | Ito et al. | |
| 2002/0080866 A1 | 6/2002 | Bouet et al. | |
| 2003/0103403 A1 | 6/2003 | Tsujino | |
| 2005/0047221 A1 | 3/2005 | Choi et al. | |
| 2005/0068836 A1 | 3/2005 | Oh | |
| 2005/0104738 A1 | 5/2005 | Todorov | |
| 2005/0281099 A1 | 12/2005 | Lovett | |
| 2006/0023542 A1 | 2/2006 | Derner et al. | |
| 2006/0120193 A1 * | 6/2006 | Casper | 365/222 |
| 2006/0146616 A1 | 7/2006 | Heo et al. | |
| 2006/0203588 A1 * | 9/2006 | Ito | 365/210 |
| 2007/0041257 A1 | 2/2007 | Kim | |
| 2007/0053226 A1 | 3/2007 | Lee et al. | |
| 2007/0063763 A1 | 3/2007 | Yoo et al. | |
| 2007/0147153 A1 | 6/2007 | Schneider et al. | |
| 2007/0242555 A1 | 10/2007 | Lee et al. | |
| 2008/0031060 A1 | 2/2008 | Chui et al. | |
| 2008/0144416 A1 | 6/2008 | Matsubara | |
| 2008/0298152 A1 | 12/2008 | Ito et al. | |
| 2009/0251959 A1 * | 10/2009 | Fukuda | 365/174 |

\* cited by examiner

*Primary Examiner* — Huan Hoang
*Assistant Examiner* — Jay Radke
(74) *Attorney, Agent, or Firm* — Schwegman, Lundberg & Woessner, P.A.

(57) ABSTRACT

Some embodiments include a voltage generator to generate a voltage to apply to a line used to access a memory cell of a memory device in which the voltage is applied to the line when the memory cell is not being accessed, and a power controller to cause the voltage to change during a time interval after a refresh operation of the memory device. Other embodiments including additional apparatus, systems, and methods are disclosed.

14 Claims, 17 Drawing Sheets

POWER SAVING MEMORY APPARATUS, SYSTEMS, AND METHODS

PRIORITY APPLICATION

This application is a continuation of U.S. application Ser. No. 11/754,756, filed May 29, 2007 now U.S. Pat. No. 8,004,920, which is incorporated herein by reference in its entirety.

FIELD

Embodiments disclosed herein relate to semiconductor devices, including power management in memory devices.

BACKGROUND

Memory devices often reside in computers and electronic products, such as digital televisions, digital cameras, and cellular phones, and are used to store data and other information. A memory device usually stores information in the form of electrical charge in memory cells of the device.

A conventional memory device often has one or more voltage generators to generate different internal voltages based on a supply voltage supplied to the memory device for various memory operations, such as refresh operations used in dynamic random access memory (DRAM) devices. Some memory devices may keep the voltage generators active even when the internal voltages are unneeded for a particular mode of operation. In some of these memory devices, keeping the voltage generators active in this manner may waste power. Therefore, there is need to improve power management in memory devices.

DETAILED DESCRIPTION

Figure 1:
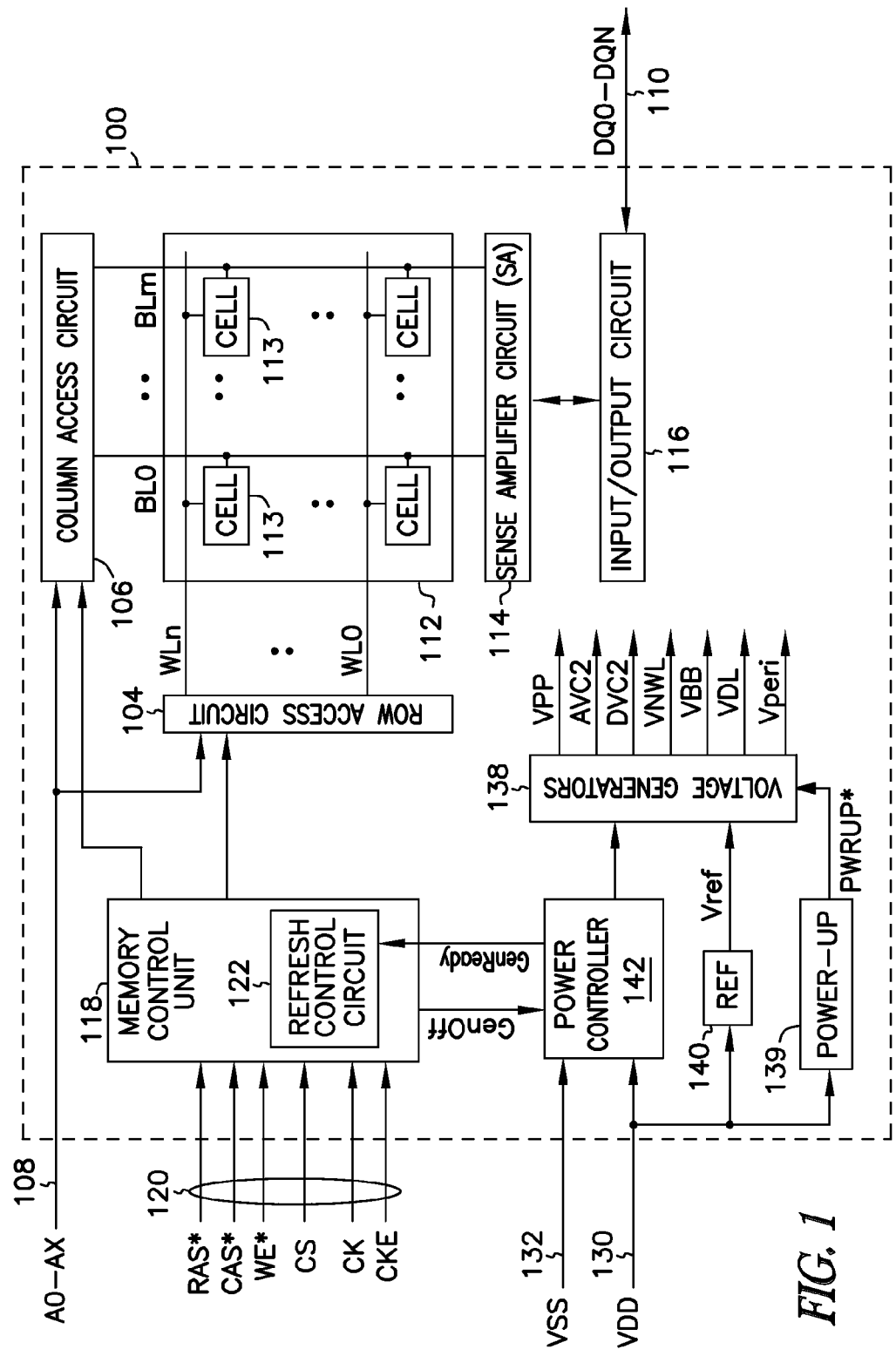
FIG. 1 shows a block diagram of a memory device according to an embodiment of the invention.

FIG. 1 shows a memory device according to an embodiment of the invention. Memory device 100 may include a memory array 112 having memory cells 113 arranged in rows and columns along with wordlines (WL0 through WLn) and bit lines (BL0 through BLm). Row and column access circuits 104 and 106 may decode address signals A0-AX on address lines (or address bus) 108 to access memory cells 113. Sense amplifier circuit 114 may sense voltage on bit lines BL0-BLm to determine the value of data read from or written to memory cells 113. An input/output circuit 116 may transfer data between memory cells 113 and data lines (or data bus) 110, which carry data signals DQ0 through DQN. A memory control unit 118, including a refresh control circuit 122, controls memory modes and memory operations of memory device 100 based on control signals on control lines 120. Examples of control signals include a row access strobe signal RAS*, a column access strobe signal CAS*, a write enable signal WE*, a chip select signal CS, a clock signal CK, and a clock enable signal CKE.

Memory device 100 may include memory operations such as a read operation to read data stored in memory cells 113, a write operation to write data into memory cells 113, and a refresh operation to refresh memory cells 113 to retain the values of data in memory cells 113. Memory device 100 may perform the read, write, and refresh operations based on a combination of signals (wherein the signals may be used to transfer commands) received at lines 120.

Memory device 100 may include memory modes such as a non-standby mode and a standby mode. The non-standby mode may occur when memory device 100 actively receives from lines 120 commands, such as read and write commands, to actively perform a read or write operation based on the commands received from lines 120. Memory device 100 may enter a standby mode when the CKE signal has one signal level and exit the standby mode when the CKE signal has another signal level. The signal level of the CKE signal may be controlled by either memory device 100 or by another device (e.g., a processor) coupled to memory device 100.

The standby mode, which may include a mode such as idling, suspense, drowsy, sleep, power-down, or other low power mode, may occur when memory device 100 does not actively receive commands, such as read or write commands, from lines 120, or does not actively perform a read or write operation based on the commands received from lines 120 in which data read from or written to memory cells 113 may be transferred between memory cells 113 and data lines 110.

In the standby mode, memory device 100 may perform read and write operations but these read and write operations are performed not based on read or write command received from lines 120 (as in the case in the non-standby mode).

Instead, they are based on an internal refresh operation in which memory device 100 may perform read and write operations as part of a refresh operation to retain the value of data stored in memory cells 113. Memory device 100 generally does not operate to transfer data between memory cells 113 and data lines 110 when read and write operations are performed as part of a refresh operation.

A refresh operation performed in a standby mode may be called a self-refresh operation. In a non-standby mode, memory device 100 may also perform a refresh operation, which may be called an auto-refresh operation.

Memory device 100 may receive supply voltages VDD and VSS on lines 130 and 132, respectively. VSS may include a ground potential (zero volts). VDD may include an external voltage supplied to memory device 100 from an external power source such as a battery or an alternating current to direct current (AC-DC) converter circuitry.

Memory device 100 may include a number of voltage generators, collectively shown as voltage generators 138, which may use supply voltage VDD to generate various voltages VPP, AVC2, DVC2, VNWL, VBB, VDL, and Vperi for internal use in memory device 100. A power-up circuit 139 and reference voltage generator (REF) 140 may use VDD to generate a power-up signal PWRUP* and a reference voltage Vref. Voltage generators 138 may respond to the PWRUP* signal and use voltage Vref to generate one more of the voltages VPP, AVC2, DVC2, VNWL, VBB, VDL, and Vperi.

Refresh control circuit 122 may perform one or more refresh operations in a standby mode based on the state of a signal GenReady (e.g., activated, or deactivated). A power controller 142 may activate the GenReady signal to indicate that voltage values of the VPP, AVC2, DVC2, VNWL, VBB, VDL, and Vperi are ready for use in a refresh operation.

Memory control unit 118 may activate the GenOff signal in a standby mode. In a standby mode, power controller 142 may respond to the GenOff signal to control voltage generators 138 by causing voltage generators 138 to inhibit the generation of one or more of voltages VPP, AVC2, DVC2, VNWL, VBB, VDL, and Vperi during a time interval during the standby mode, such as to save power.

Figure 2:
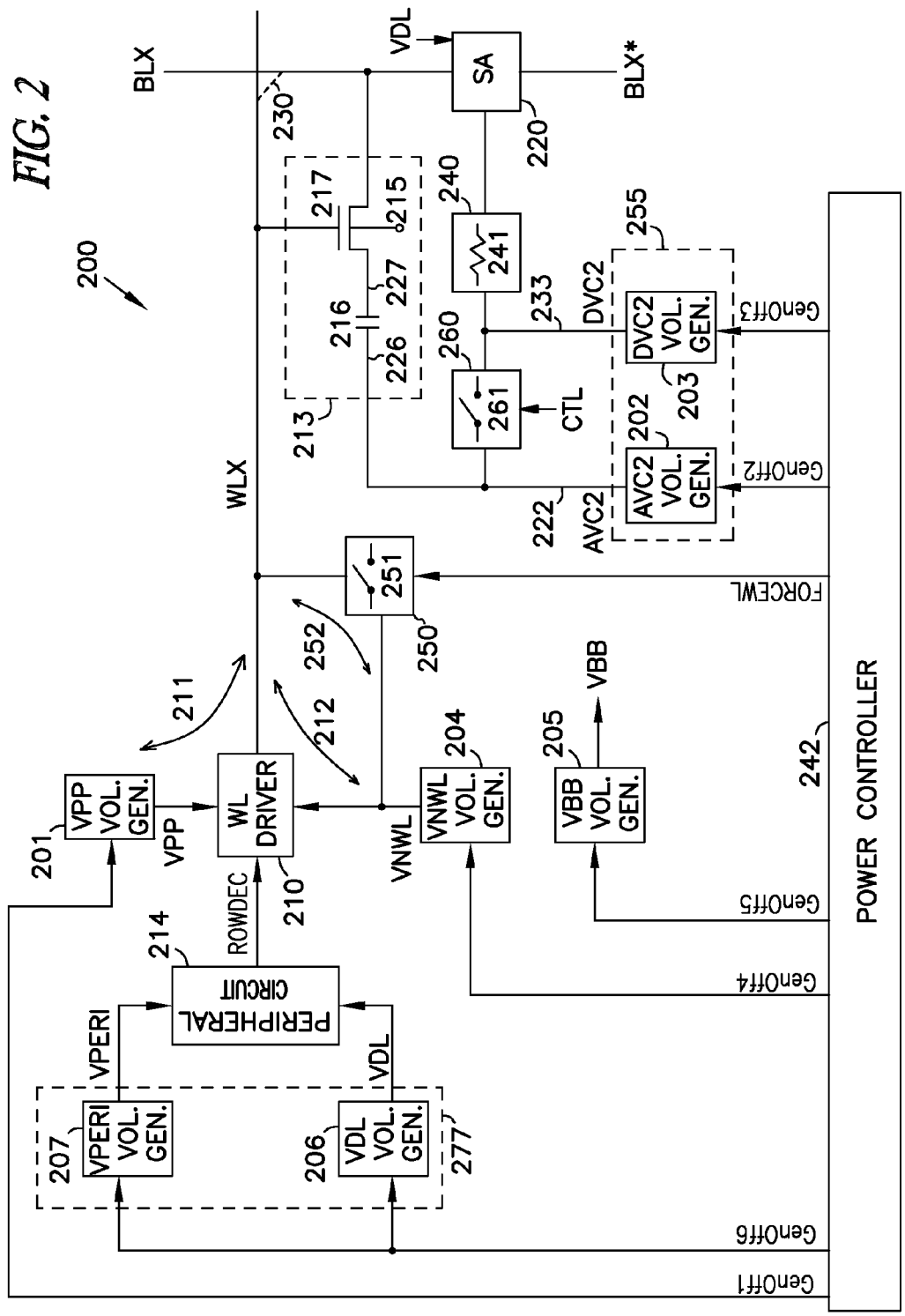
FIG. 2 shows a partial block diagram of a memory device including voltage generators according to an embodiment of the invention.

FIG. 2 shows a partial block diagram of a memory device 200 including voltage generators 201, 202, 203, 204, 205, 206, and 207 to generate corresponding voltages VPP, AVC2, DVC2, VNWL, VBB, VDL, and Vperi according to an embodiment of the invention. In some embodiments, memory device 100 of FIG. 1 may include the memory device 200 shown in FIG. 2.

Voltage VPP may comprise a positive wordline voltage. Voltage AVC2 may comprise a plate voltage. Voltage DVC2 may comprise a precharge voltage. Voltage VNWL may comprise a negative wordline voltage. Voltage VBB may comprise a negative substrate voltage. Voltage VDL may comprise a bit line voltage. Voltage Vperi may comprise a peripheral voltage.

As shown in FIG. 2, a circuit 255 may include a combination of AVC2 voltage generator 202 to generate voltage AVC2, and DVC2 voltage generator 203 to generate voltage DVC2. A circuit 277 may include a combination of VDL voltage generator 206 to generate voltage VDL, and Vperi voltage generator 207 to generate voltage Vperi.

A power controller 242 may generate signals GenOff1, GenOff2, GenOff3, GenOff4, GenOff5, and GenOff6 during a standby mode to cause voltage generators 201 through 207 to inhibit generation of voltages VPP, AVC2, DVC2, VNWL, VBB, VDL, and Vperi. Inhibiting the generation of a voltage, such as one of VPP, AVC2, DVC2, VNWL, VBB, VDL, and Vperi, may cause the value of the voltage to increase, decrease, or cause a voltage generator that generates the voltage to stop generating the voltage and let its output node (where the corresponding voltage is provided) "float".

A wordline driver 210 may respond to signal ROWDEC to selectively apply voltages VPP and VNWL to a wordline WLX. For example, when the ROWDEC signal has a first signal level (e.g., high), wordline driver 210 may apply voltage VPP, via circuit path 211, to wordline WLX to access memory cell 213. In another example, when the ROWDEC signal has a second signal level (e.g., low), wordline driver 210 may apply voltage VNWL, via circuit path 212, to wordline WLX when memory cell is not being accessed. Wordline driver 210 may be a part of row access circuit such as of row access circuit 104 of FIG. 1. In FIG. 2, a peripheral circuit 214 of memory device 200 may control the signal level of the ROWDEC signal. For example, when memory cell 213 is selected to be accessed (for a read or write operation), peripheral circuit 214 causes the ROWDEC signal to be at a high signal level (high) and when memory cell 213 is not selected to be accessed, peripheral circuit 214 causes the ROWDEC signal to be at a low signal level (low). Peripheral circuit 214 may comprise circuitry of memory device 200 such as a memory control unit, a row and column access circuit, and an input/output circuit, similar or identical to those of memory device 100 of FIG. 1.

Figure 5:
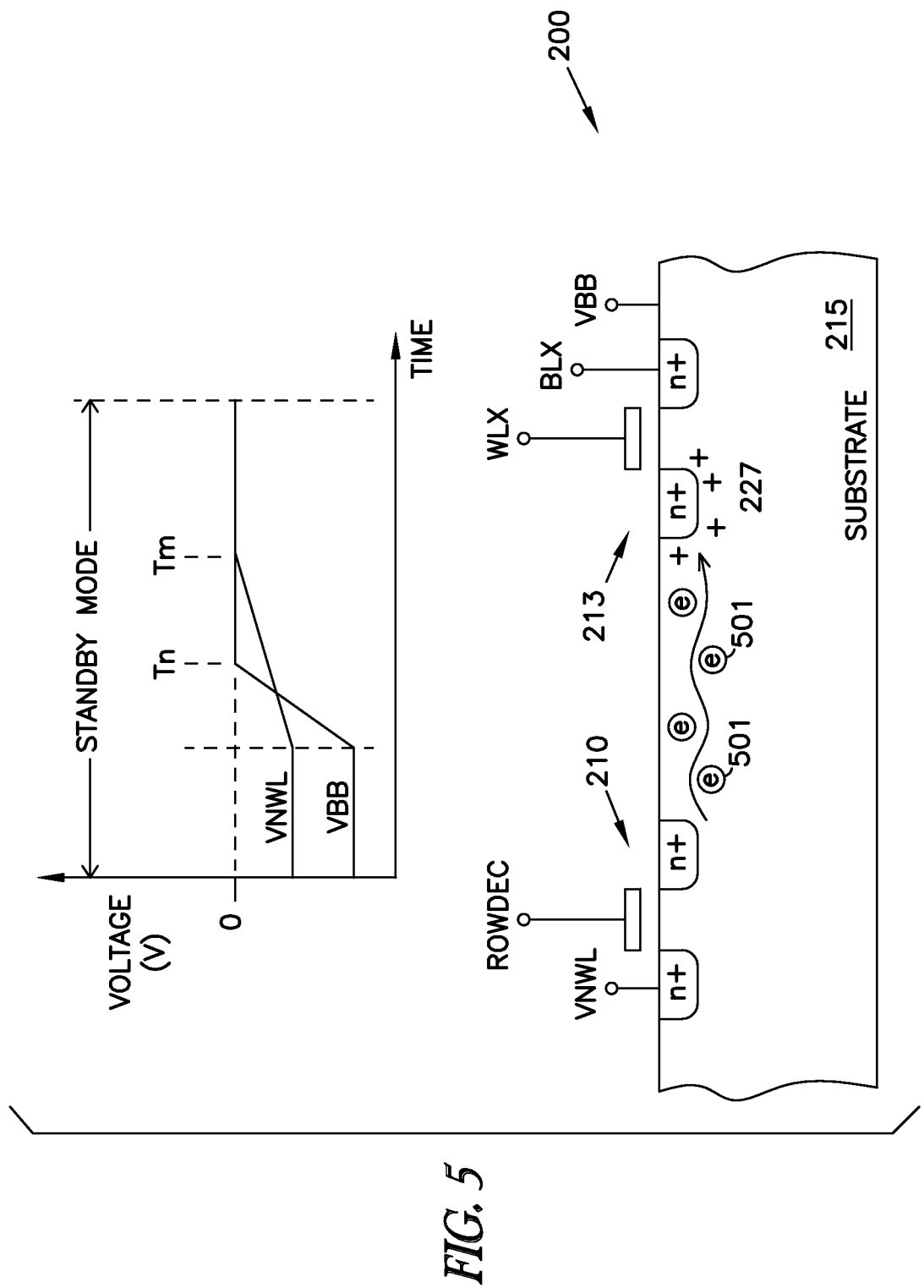
FIG. 5 shows waveforms of some voltages linked to a cross-section of the memory device of FIG. 2.

Memory device 200 in FIG. 2 may apply voltage VBB to a substrate of memory device 200. The substrate of memory device 200 may include an area having semiconductor material (e.g., silicon) where components of memory device 200, including memory cell 213, are formed. The substrate of memory device 200 is symbolically shown in FIG. 2 as substrate 215. FIG. 5 below also shows a cross-section of substrate 215 of memory device 200 of FIG. 2.

Figure 6:
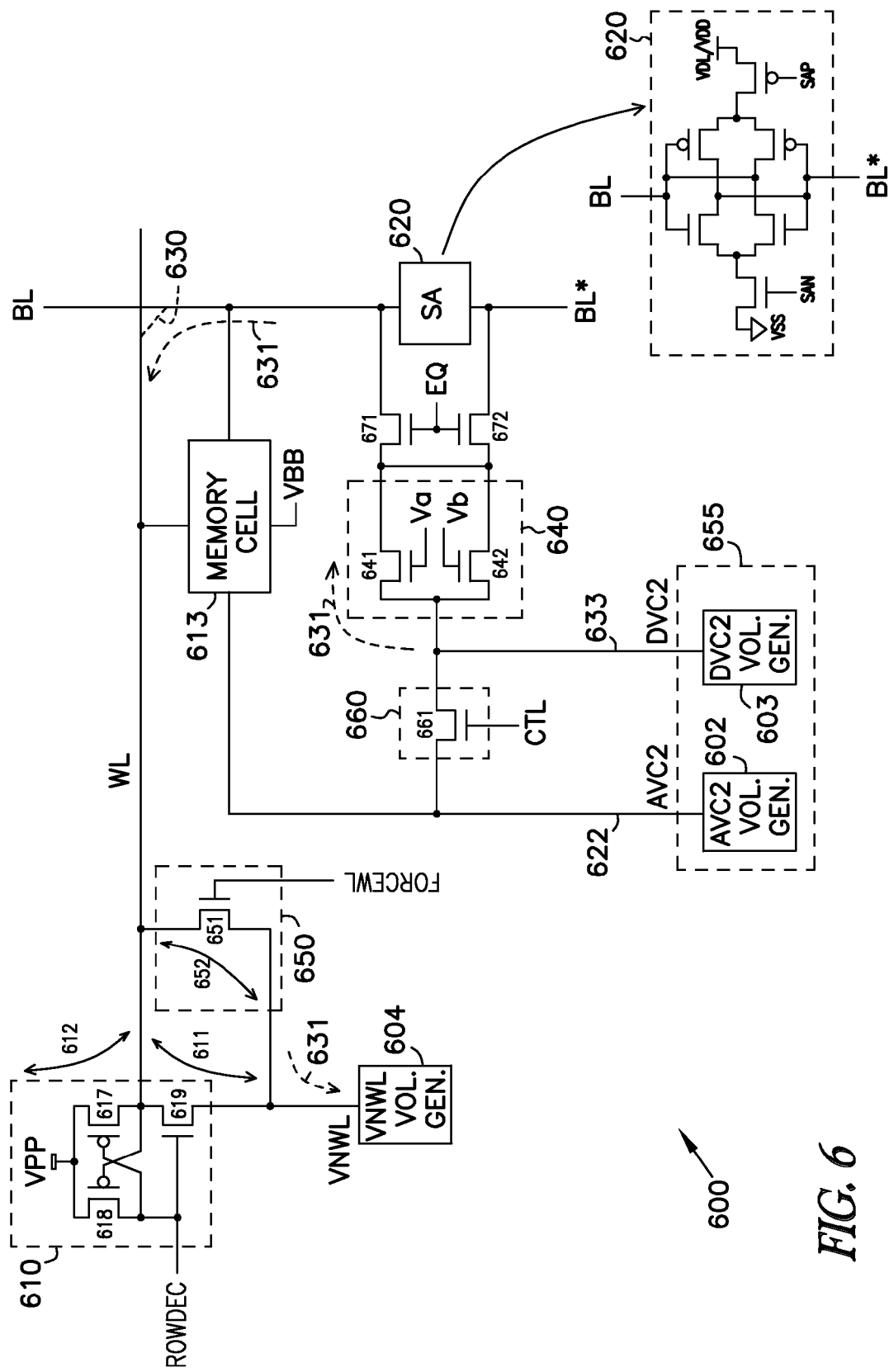
FIG. 6 shows a partial schematic diagram of a memory device including a bleeder circuit, an isolation circuit, and a coupling circuit according to an embodiment of the invention.

As shown in FIG. 2, memory cell 213 may include a capacitor 216 to store data in the form of charge, and a transistor 217 to access capacitor 216 based on a voltage value applied to wordline WLX by wordline driver 210. A bit line BLX may transfer data read from or written to memory cell 213 (data is stored in the form of charge at a storage node, such as capacitor terminal 227) when transistor 217 is turned on. Wordline WLX may comprise one of the wordlines WL0 through WLn of FIG. 1. Bit line BLX and BLX* in FIG. 2 may comprise two of the bit lines BL0 through BLm of FIG. 1. Memory device 200 of FIG. 2 may use bit line BLX* for a sensing operation. PA sense amplifier (SA) 220 may perform a sensing operation based on voltage values on bit lines BLX and BLX* to determine the value of data read from or written to memory cells 213. FIG. 6 shows more circuit detail of a sense amplifier 620 similar to or identical to the sense amplifier 220 of FIG. 2.

Memory device 200 may operate to apply voltage AVC2 to terminal 226 of capacitor 216. Memory device 200 may operate to apply voltage DVC2 to bit line BLX to precharge bit line BLX for a sensing function during refresh operation.

Memory device 200 may operate to apply voltage VDL to peripheral circuit 214 and to sense amplifier 220. Memory device 200 may operate to apply voltage Vperi to peripheral circuit 214. Voltage Vperi may have a higher value than voltage VDL. Peripheral circuit 214 and sense amplifier 220 may use voltages Vperi and VDL as internal supply voltages (which are different from external supply voltages, e.g., VDD of FIG. 1).

Memory device 200 of FIG. 2 may include a bleeder circuit 240, which may form part of a memory array of memory device 200, such as memory array 112 of memory device 100 FIG. 1. In memory device 200 of FIG. 2, in some cases, micro particles such as dust or manufacturing debris may inadvertently create a defect, such as a short circuit path 230 between wordline WLX and bit line BLX. Short circuit path 230 may have an insignificant impact on the overall function of memory device 200 but may create a path for current (e.g., DC standby current) to leak, thereby wasting power. For example, when short circuit path 230 exists, current (e.g., potential short circuit current) may leak and flow from DVC2 voltage generator 203 (at a higher voltage value) to VNWL voltage generator 204 (at a lower voltage value) via short circuit path 230. Bleeder circuit 240 may include a resistive device, symbolically shown as resistance symbol 241, that operates to create a resistance between output node 233 of DVC2 voltage generator and bit line BLX to reduce the short circuit current that may occur because the existence of short circuit path 230.

Memory device 200 may include a coupling circuit 250 with a switch 251. Coupling circuit 250 may respond to a signal FORCEWL from power controller 242 to couple wordline WLX to VNWL voltage generator 204 via circuit path 252, e.g., by closing switch 251. As shown in FIG. 2, circuit path 252 is an additional circuit path separated from circuit path 212. In a standby mode, wordline driver 210 may couple wordline WLX to VNWL voltage generator 204 via circuit path 212 in which voltage VNWL may increase from a negative value to approximately zero volts. In some cases, in a standby mode, VPP voltage generator 201 may reduce voltage VPP to some value (e.g., approximately zero volts) to save power. Reducing voltage VPP to some voltage, such as approximately zero volts and increasing voltage VNWL to approximately zero volts, may introduce instability to the connection between wordline WLX to VNWL voltage generator 204. By coupling wordline WLX to VNWL voltage generator 204 via circuit path 252 (in addition to circuit path 212) when voltage VPP is reduced to some value, coupling circuit 250 may help maintain stability in the connection between wordline WLX to VNWL voltage generator 204. In some embodiments, for example in embodiments where the voltage VPP is reduced to a voltage higher than approximately zero volts, memory device 200 may omit coupling circuit 250 because instability in the connection between wordline WLX to VNWL voltage generator 204 may not occur as a result of the value voltage VPP being higher than the value (e.g., approximately zero volts) of voltage VNWL.

Memory device 200 may include an isolation circuit 260 with a switch 261 coupled between an output node 222 of AVC2 voltage generator 202 and output node 233 of DVC2 voltage generator. Isolation circuit 260 may respond to a signal CTL, which may be generated by a circuit 255. Voltages AVC2 and DVC2 may have an equal value during some duration of a refresh operation. Circuit 260 may respond to the CTL signal to isolate (e.g., electrically decouple) output node 222 from output node 233 (e.g., by opening switch 261) to allow the voltage value (e.g., value of voltage AVC2) at output node 222 and the voltage value (e.g., value of voltage DVC2) at output node 233 to be independent from each other in the time interval after a refresh operation. Before the isolation (e.g., switch 261 is closed), both output nodes may have an equal voltage value (i.e., AVC2=DVC2). After the isolation (e.g., switch 261 is open), DVC2 voltage generator 203 may cause the value of voltage DVC2 to be higher than the value of voltage AVC2 to allow retention of data stored in memory cell 213 after a refresh operation in a standby mode of memory device 200.

As described above, memory device 200 may operate to inhibit the generation of one or more of voltages VPP, AVC2, DVC2, VNWL, VBB, VDL, and Vperi for a time interval to save power.

Figure 3:
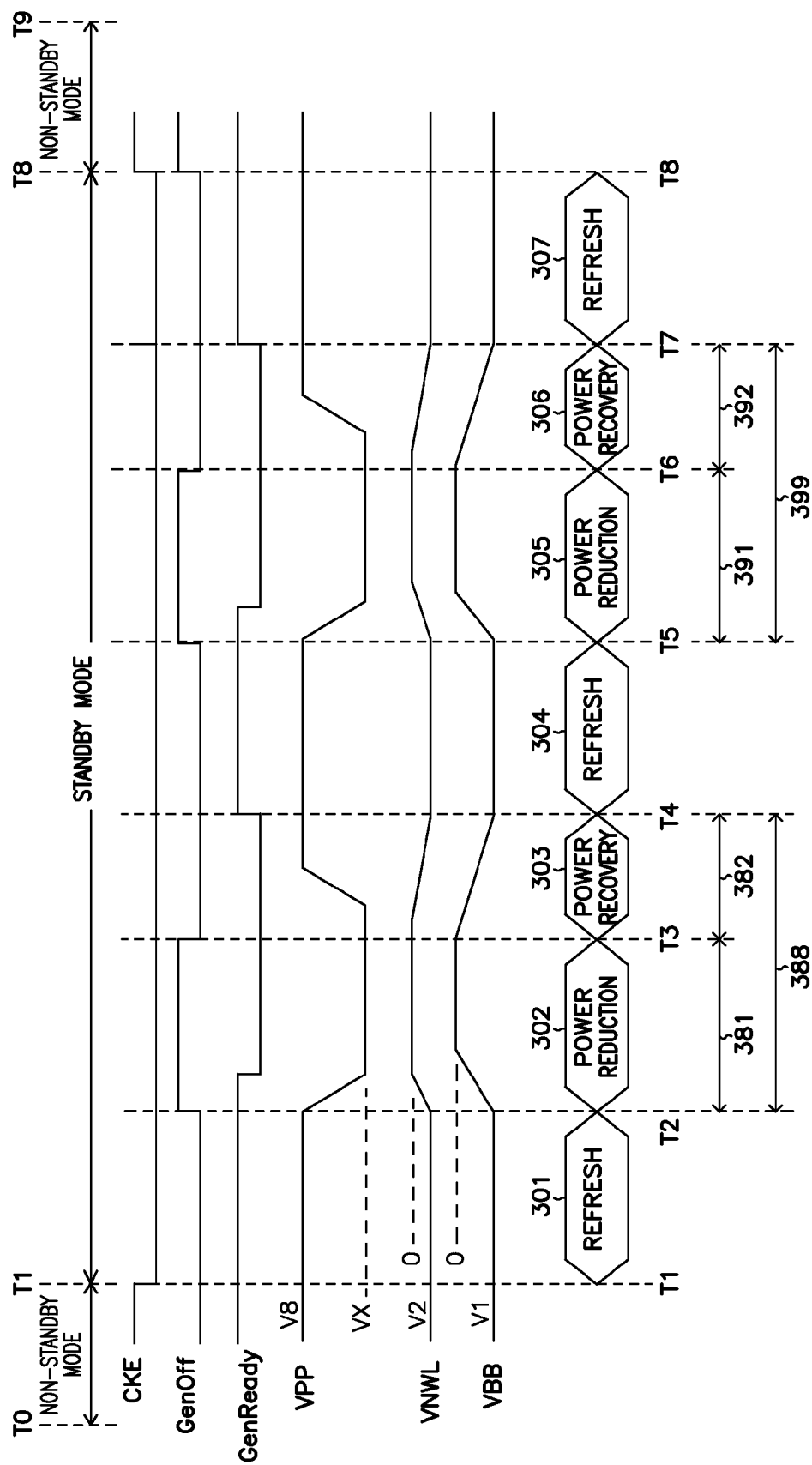
FIG. 3 is a timing diagram for various memory modes, memory operations, and waveforms of some voltages of the memory device of FIG. 2.

FIG. 3 is a timing diagram for various memory modes, memory operations, and waveforms of some voltages of memory device 200 of FIG. 2. In FIG. 3, T0, T1, T2, T3, T4, T5, T6, T7, T8, and T9 represent times. As shown in FIG. 3, the memory modes of memory device 200 may include a standby mode between times T1 and T8, and non-standby modes between times T0 and T1, and between times T8 and T9, respectively. The memory operations in the standby mode may include refresh operations 301, 304, and 307, power reduction operations 302 and 305, and power recovery operations 303 and 306. For clarity, FIG. 3 shows an example of three refresh operations, two power reduction operations, and two power recovery operations. In some embodiments, the number of these operations may vary.

Memory device 200 may enter the standby mode at time T1 when the CKE signal changes from a first signal level to a second signal level (e.g., high to low) and exit the standby mode at time T8 when the CKE signal changes from the second signal level back to the first signal level (e.g., low to high).

As shown in FIG. 3, in the standby mode, memory device 200 may perform refresh operations 301, 304, and 307 when the GenReady signal has a high signal level. Memory device 200 may perform power reduction operations 302 and 305 during time interval 381 (between times T2 and T3) and time interval 391 (between times T5 and T6) when the GenOff signal has a high signal level. Memory device 200 may perform power recovery operations 303 and 306 during time interval 382 (between times T3 and T4) and time interval 392 (between times T6 and T7) when the GenOff signal has a low signal level. Time intervals 381 and 382 may be collectively referred to as time interval 388. Time intervals 391 and 392 may be collectively referred to as time interval 399.

As show in FIG. 3, during time interval 381 after refresh operation 301, the value of voltage VPP may reduce from V8 to VX, the value of voltage VNWL may increase from V2 to zero volts, and the value of VBB may increase from V1 to zero volts. During time interval 382, the values of voltages VPP, VNWL, and VBB may return to (which may otherwise be referred to as "recover") their corresponding values before refresh operation 304. During time interval 399, the values of VPP, VNWL, and VBB may reduce, increase, and recover their values in a fashion similar or identical to that which occurs during time intervals 381 and 382.

FIG. 3 shows waveforms of voltages VPP, VNWL, and VBB to generally illustrate a how a voltage may increase or decrease in value when memory device 200 inhibits generation by a voltage generator that generates the voltage. The order in which the voltage values VPP, VNWL, and VBB and other voltages (AVC2, DVC2, VDL, and Vperi) can be increased or decreased is shown in detail in FIG. 4.

Figure 4:
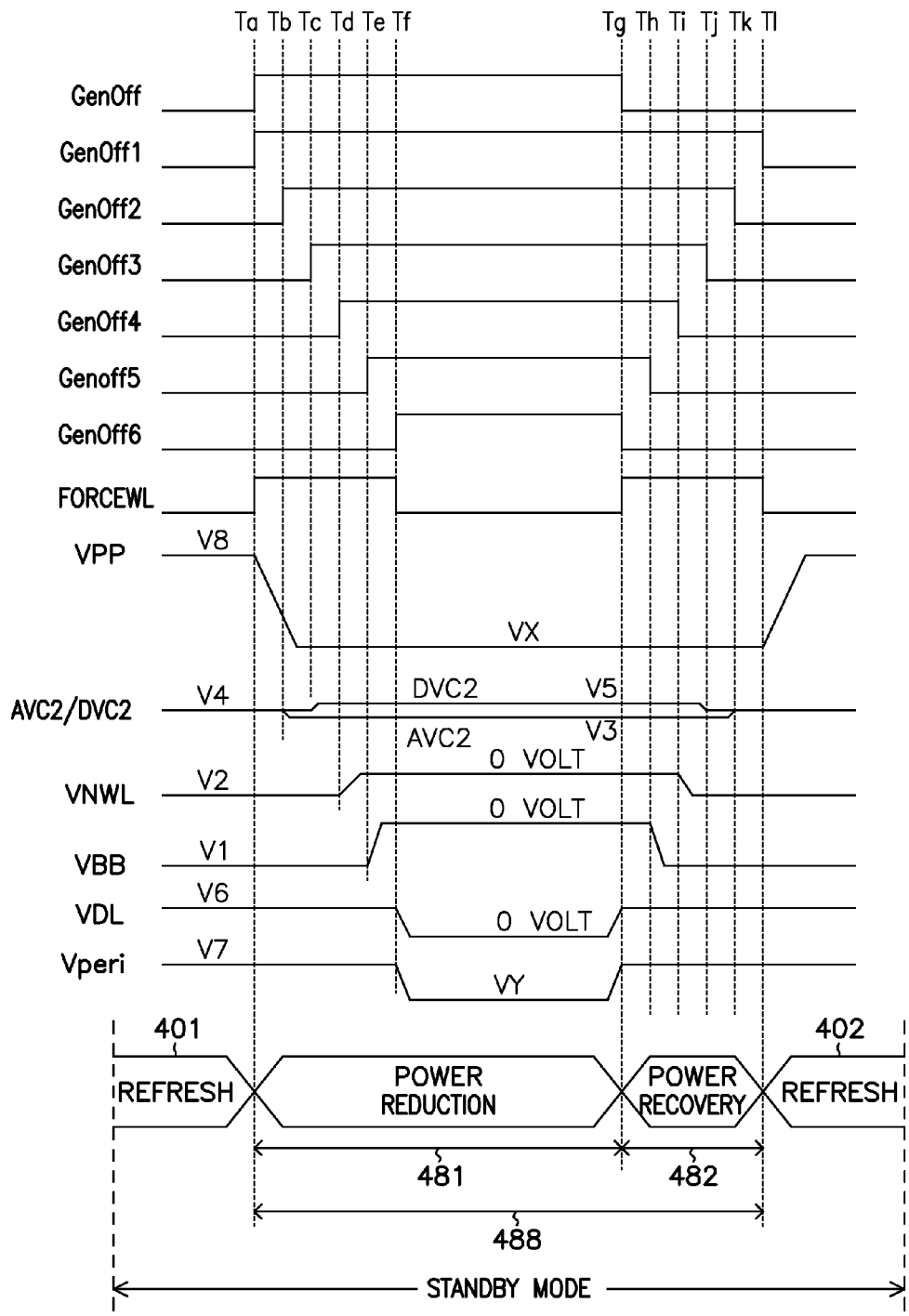
FIG. 4 is a timing diagram showing waveforms of various voltages during a time interval after a refresh operation in a standby mode of the memory device of FIG. 2.

FIG. 4 is a timing diagram showing waveforms of various voltages during a time interval after a refresh operation 401 in a standby mode of memory device 200 of FIG. 2. In FIG. 4, the standby mode comprises part of the standby mode between times T1 and T8 of FIG. 3. Time intervals 488 of FIG. 4 may comprise either of the time intervals 388 or 399 of FIG. 3. Refresh operations 401 and 402 may comprise two of the refresh operations 301, 304, and 307 of FIG. 3. The GenOff signal of FIG. 4 may include a portion of the GenOff signal of FIG. 3.

As shown in FIG. 4, during time interval 481, power controller 242 (FIG. 2) may change the signal level of each of the GenOff1 through GenOff6 signals (e.g., from low to high) in a sequential order to reduce or increase the value of each of the voltages VPP, AVC2, DVC2, VNWL, VBB, VDL, and Vperi. During time interval 482, power controller 242 may change the signal level of each the GenOff1 through GenOff6 signals (e.g., from high to low) in an order reversed from the sequential order at time 481 to recover the values of voltages VPP, AVC2, DVC2, VNWL, VBB, VDL, and Vperi before conducting the refresh operation 402.

FIG. 4 shows all signals GenOff1 through GenOff6 can be changed during time interval 481 to change the values of voltages VPP, AVC2, DVC2, VNWL, VBB, VDL, and Vperi. In some embodiments, fewer than all of GenOff1 through GenOff6 are activated such that fewer than all of VPP, AVC2, DVC2, VNWL, VBB, VDL, and Vperi change in value. The order in which the values of voltages VPP, AVC2, DVC2, VNWL, VBB, VDL, and Vperi are changed in some embodiments is described as follows.

At time Ta, the GenOff1 signal may change its signal level from low to high. In response, voltage VPP may reduce its value from V8 to VX. V8 may include a value higher than a supply voltage (e.g., VDD of FIG. 1) supplied to memory device 200 of FIG. 2. V8 may have a range of approximately 3.2 volts to 3.5 volts. VX may include a value lower than the value of the supply voltage. In some embodiments, VX=VDD–Vt, where VDD is the supply voltage and Vt is the threshold voltage of a transistor of memory device 200. VDD may have a value of approximately 1.8 volts, and VX may have a value of approximately 1.4 volts. In other embodiments, VX may include a ground potential.

As shown in FIG. 4, before time Tb (between times Ta and Tb), AVC2 is approximately equal to DVC2 (AVC2=DVC2). In this description, when two quantities or two sides of an equation are said to be approximately equal (or are said to be equal), it means that, for example, a difference of 50 millivolts or less exists between the two quantities or between two sides of the equation.

At time Tb, the GenOff2 signal may change its signal level from low to high. In response, voltage AVC2 may reduce its value from V4 (e.g., a value where AVC2=DVC2) to V3. A transistor (FIG. 2) may then isolate output node 222 from output node 233 to allow voltage AVC2 to be independent from voltage DVC2. In FIG. 4, V4 and V3 may have values of approximately 0.7 and 0.6 volts, respectively.

At time Tc, the GenOff3 signal may change its signal level from low to high. In response, voltage DVC2 may increase its value from V4 to V5. V5 may have a value of approximately 0.8 volts. Causing voltage DVC2 to be higher than voltage AVC2 as shown in FIG. 4 may help maintaining the value of data in memory cell 213 (see FIG. 2) during time interval 488.

At time Td in FIG. 4, the GenOff4 signal may change its signal level from low to high. In response, voltage VNWL may increase its value from V2 to zero volts (ground potential). V2 may have a value of approximately –0.3 volts.

At time Te, the GenOff5 signal may change its signal level from low to high. In response, voltage VBB may increase its value from V1 to zero volts. V1 may have a range of approximately –0.5 to –1.0 volts.

At time Tf, the GenOff6 signal may change its signal level from low to high. In response, voltage VDL may decrease its value from V6 to zero volts, and voltage Vperi may decrease its value from V7 to VY. V6 may have a value of VDD–Vt (e.g., approximately 1.4 volts). V7 may have a value approximately equal to the supply voltage supplied to memory device 200 (e.g., VDD of FIG. 1) and VY may have a value of VDD-Vt.

In some embodiments, instead of changing their values based on separate GenOff2 and GenOff3 signals as shown in FIG. 4, AVC2 and DVC2 may change their values based on the same GenOff2 signal. In these embodiments, VDL may change its value based on the GenOff3 signal (instead of the GenOff6 signal as shown in FIG. 4) such that VDL may reduce its value before the values of voltages VNWL and VBB are reduced.

In FIG. 4, the power recovery operation during time interval 482 may start at time Tg. As mentioned above, power controller 242 may change the signal level of each the GenOff1 through GenOff6 signals from (e.g., from high to low) in an order reversed from the sequential order at time 481 to recover the values of voltages VPP, AVC2, DVC2, VNWL, VBB, VDL, and Vperi before refresh operation 402 starts. In FIG. 4, the GenOff6, GenOff5, GenOff4, GenOff3, GenOff2, and GenOff1 may change from high to low at corresponding times Tg, Th, Ti, Tj, Tk, and Tl.

As described above with reference to FIG. 2, a power controller 242 may control the FORCEWL signal to wordline WLX to VNWL voltage generator 204 via circuit path 252. In FIG. 4, the FORCEWL signal may be controlled such that it may have one signal level (e.g., high) between times Ta and Tf and between times Tg and Tl, and another signal level (e.g., low) between times Tf and Tg. In some embodiments, based on the signal level of the FORCEWL signal, wordline WLX (FIG. 2) may be coupled to VNWL voltage generator (FIG. 2) when the value of VX in FIG. 4 is equal to a ground potential. In other embodiments, when the value VX is greater than the ground potential (e.g., VDD-Vt, or approximately 1.4 volts) the FORCEWL signal may be unused or coupling circuit 250 (FIG. 2) may be omitted.

As shown in FIG. 4, the value of voltage VNWL may go to zero volts before the value of voltage VBB does, such as to help maintain stability in the value of data stored memory cell 213. In some embodiments, if the value of voltage VBB goes to zero volts before the value of voltage VNWL does (i.e., VBB is more positive than VNWL at some point), then the value of data stored in memory cell 213 may be compromised, as described with reference to FIG. 5.

FIG. 5 shows waveforms of some voltages linked to a cross-section of the memory device 200 of FIG. 2. Waveforms of voltage VNWL and VBB in a standby mode are shown, in which the value of voltage VBB may go to zero volts before the value of voltage VNWL does, and this activity is linked to a cross-section of memory device 200 of FIG. 2 including a portion of memory cell 213 and a portion of wordline driver 210 according to an embodiment of the invention. As shown in FIG. 5, the value of VBB may go to zero volts at time Tn (before time Tm) whereas the value of VNWL may go to zero volts at time Tm. The value of data in memory cell 213 may be compromised if the waveforms of VNWL and VBB shown in FIG. 5 occur.

If the value of voltage VBB goes to zero volts before the value of voltage VNWL does, substrate 215 may be at a potential of zero volts while value of voltage VBB may still have a negative value. This may cause capacitor terminal 227 to attract minority carriers (electrons 501) from wordline driver 210, causing them to move toward capacitor terminal 227. As a result, the value of data stored in capacitor terminal 227 may be compromised. Therefore, memory device 200 may avoid the situation of data being comprised, as described herein with reference to FIG. 5, by causing the value of voltage VNWL to go to zero volts before the value of VBB does, as shown during time interval 481 of FIG. 4.

FIG. 6 shows a partial schematic diagram of a memory device 600 including bleeder circuit 640, isolation circuit 660, and coupling circuit 650 according to an embodiment of the invention. Memory device 600 may include a memory control unit, similar or identical to memory control unit 118 of FIG. 1, to generate signals EQ, SAN, SAP, Va, and Vb. In some examples, the signal Va may be coupled to voltage VPP or supply voltage VDD. FIG. 6 shows voltage VBB being coupled to only memory cell 613 for simplicity. Voltage VBB may also couple to other components of memory device 600 such as to a substrate where the transistors of FIG. 6 are formed. For ease of describing the operation of memory device 600, the following description also refers to FIG. 7, which shows waveforms of various signals of FIG. 6 during a refresh operation 704, and time intervals 782 and 791 where memory device 600 may perform power recovery and reduction operations, respectively. Time intervals 782 and 791 may correspond to time intervals 382 and 391, respectively, of FIG. 3. Refresh operation 704 in FIG. 7 may correspond to refresh operation 304 of FIG. 3.

Figure 7:
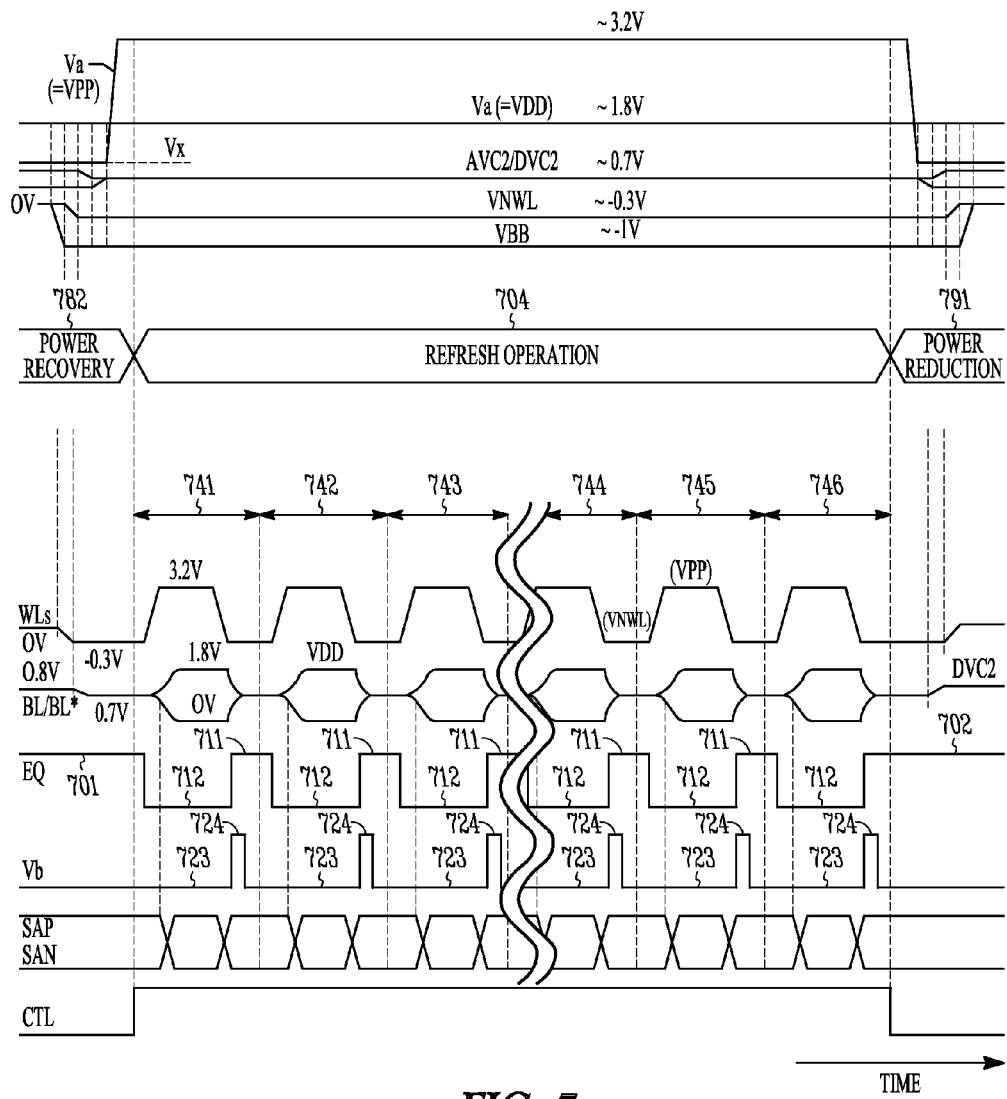
FIG. 7 shows waveforms of various signals of FIG. 6.

In FIG. 7, refresh operation 704 may include a burst refresh to refresh all cells of memory device 600. For example, as shown in FIG. 7, a burst refresh may include a series of refresh cycles 741, 742, 743, 744, 745, and 746 (one after another) where a wordline (e.g., WL in FIG. 6) or row may be activated (e.g. high) in one of refresh cycles 741, 742, 743, 744, 745, and 746 to open the cells (e.g., cell 613) associated with that wordline to refresh the data in the cells. Thus, if memory device 600 includes "n" wordlines (or rows), where "n" an integer, then "n" refresh cycles may be performed during refresh operation 704 to refresh all memory cells associated with the "n" wordlines. For simplicity, FIG. 7 shows waveforms of all wordlines (WLs) of memory device 600 where each wordline may be activated in one of refresh cycles 741, 742, 743, 744, 745, and 746. For example, wordline WL in FIG. 6 may be activated high (e.g., from VNWL to VPP in FIG. 7) during the refresh cycle 741 to refresh the memory cells associated with wordline WL, and second wordline of memory device 600 may be activate during refresh cycles 742 to refresh the memory cells associated with the second wordline, and so on.

FIG. 7 shows example voltage values (e.g., 3.2V (volt), 1.8V, 0.7V, and other voltage values) only for illustration purposes. The waveforms in FIG. 7 are not limited to the example voltage values shown in FIG. 7. Other voltage values may be used.

In FIG. 6, memory device 600 may include equalization transistors 671 and 672, which are normally turned on during time intervals 782 and 791 based on the EQ signal staying at a high signal level (e.g., at levels 701 and 702 in FIG. 7). Transistors 671 and 672 in FIG. 6 may be repeatedly turned on and off during a refresh operation, such as refresh operation 704 (FIG. 7), when the EQ signal repeatedly switches between high and low (e.g., high signal level 711 and low signal level 712).

A sense amplifier 620 may respond to signals SAN and SAP to couple BL and BL* to opposite potentials (e.g., zero volts and VDD (or VDL) in FIG. 7) based on the value of data read from or written to a memory cell (e.g., memory cell 613 in FIG. 6) during an operation such a read operation, write operation, or a refresh operation (e.g., refresh operation 704 in FIG. 7). The potential on bit line BL may be written back to memory cell 613 during the refresh operation to retain the original value of the data.

Bleeder circuit 640 may include a transistor 641, which may respond to the Va signal. As shown in FIG. 6, a short circuit path 630 (similar or identical to short circuit path 230 of FIG. 2) may be formed between wordline WL and bit line BL. Thus, short circuit current may flow from DVC2 voltage generator 603 to VNWL voltage generator 604 via path 631, which includes short circuit path 630. Transistor 641 (normally on) may operate to create a resistance on path 631 to reduce the short circuit current. The Va signal may have a sufficient value (e.g., approximately 1.4, 1.8, or 3.2 volts, or other value) to keep transistor 641 turned on. The value of the Va signal may include the value of voltage VPP, supply voltage VDD, or other voltage. For example, Va may be coupled to VPP such that, as shown in FIG. 7, Va may have a value of VPP of approximately 1.4 volts during power reduction 791 when VPP is set to be VX of approximately 1.4 volts (not VX of zero volts) during power reduction 791, and a value of approximately 3.2 volts during refresh operation 704. In another example, Va may be coupled to VDD such that, as shown in FIG. 7, Va may have a value of VDD of approximately 1.8 volts during power reduction 791 and refresh operation 704 when VDD is approximately 1.8 volts.

Bleeder circuit 640 may also include transistor 642, which may respond to the Vb signal. Memory device 600 may have a precharge operation to apply the same voltage DVC2 (e.g., approximately 0.7 volt in FIG. 7) to bit lines BL and BL* before a sensing operation is performed (e.g., when the EQ signal is high at level 711). The Vb signal (FIG. 6 and FIG. 7) may briefly change from low to high (e.g., low signal level 723 and high signal level 724) to turn on transistor 642 to assist the precharge operation by creating an additional path between DVC2 voltage generator 603 and bit lines BL and BL* (via transistors 671 and 672) so that voltage DVC2 may strongly supply bit lines BL and BL* with voltage DVC2 during the precharge operation.

Isolation circuit 660 may include a transistor 661, which may respond to a signal CTL to isolate an output node 622 of AVC2 voltage generator 602 from an output node 633 of DVC2 voltage generator 603. For example, the CTL signal (FIG. 7) may have a low signal level during time intervals 782 and 791 to turn off transistor 661 to isolate output nodes 622 and 633 from each other so that each of AVC2 and DVC2 voltages may have a different voltage value (e.g., approximately 0.6 volt for AVC2 and approximately 0.8 volt for DVC2).

Wordline driver 610 in FIG. 6 may include transistors 617, 618, and 619 to couple wordline WL to voltage VPP via path 612 (e.g. when ROWDEC is low) and to couple wordline WL to voltage VNWL via path 611 (e.g. when ROWDEC is high).

Coupling circuit 650 may include a transistor 651, which may respond to a signal FORCEWL to couple wordline WL to voltage VNWL via circuit path 652. For example, in embodiments where voltage VPP is reduced to zero volts (e.g., VX=0 in FIG. 4) in a standby mode (e.g., during time interval 488 of FIG. 4), the connection between wordline WL and VNWL voltage generator 604 in FIG. 6 may be unstable because both voltages VNWL and VPP may have a value equal to approximately zero volts during the standby mode. When voltages VNWL and VBB reduce to approximately zero volts, coupling wordline WL to VNWL voltage generator 604 via circuit path 652 using transistor 651 may provide additional stability to the connection between WL to VNWL voltage generator 604.

Figure 8:
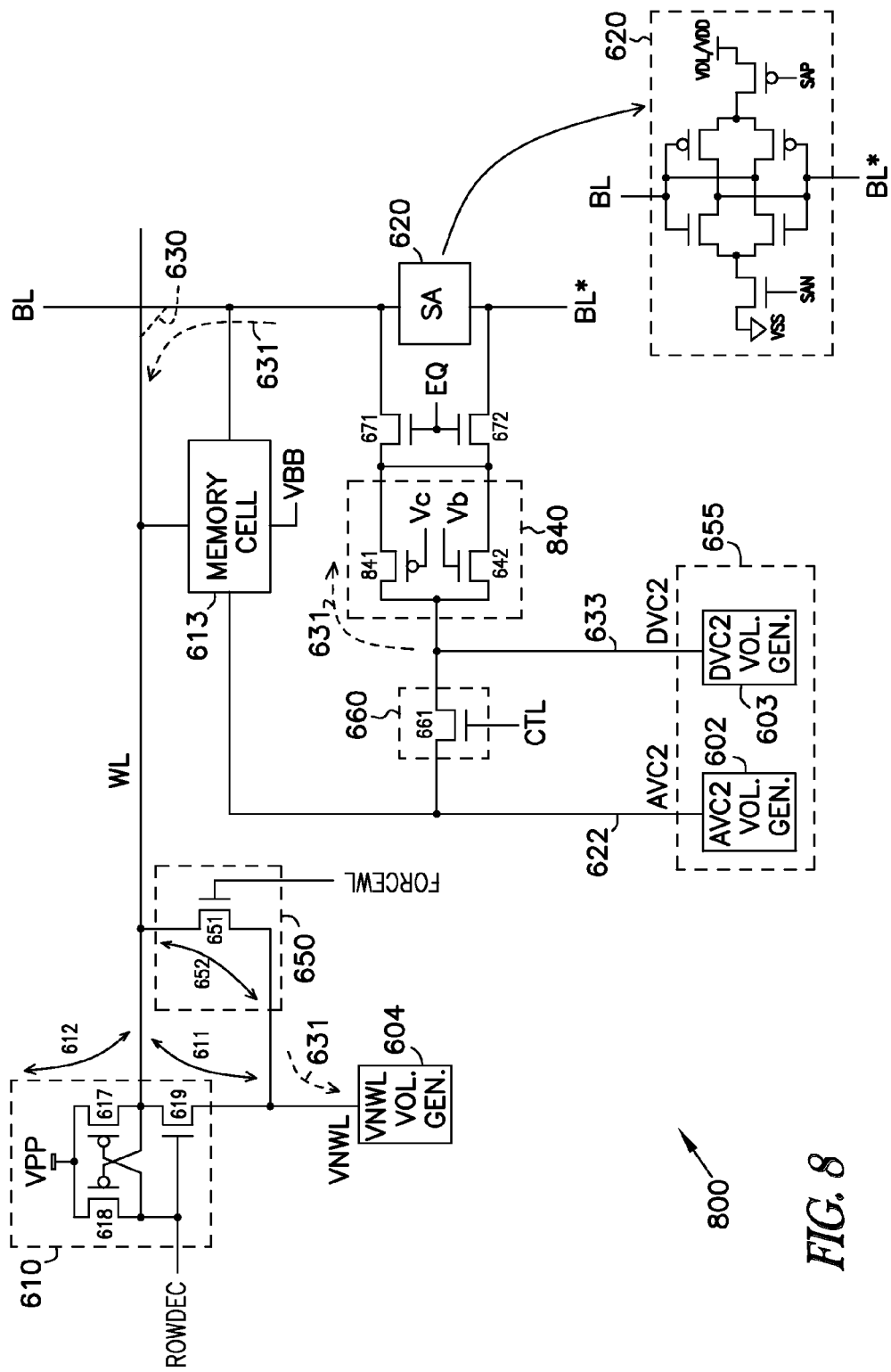
FIG. 8 shows a partial schematic diagram of memory device including a bleeder circuit with a p-channel transistor according to an embodiment of the invention.

FIG. 8 shows a partial schematic diagram of a memory device 800 including bleeder circuit 840 with a p-channel transistor 841 according to an embodiment of the invention. Memory device 800 may include components similar or identical to memory device 600 of FIG. 6, except for bleeder circuit 840 of FIG. 8. Similar or identical components between FIG. 6 and FIG. 8 are labeled with the same reference numbers. In FIG. 8, bleeder circuit 840 may include p-channel transistor 841 instead of an n-channel transistor such as transistor 641 of FIG. 6. Memory device 800 may use a signal Vc to turn on transistor 841. In some embodiments, the value of the Vc signal may include a value of voltage VBB.

Bleeder circuit 840 may operate to reduce a short circuit current in a way similar or identical to that of bleeder circuit 640 of FIG. 6.

Figure 9:
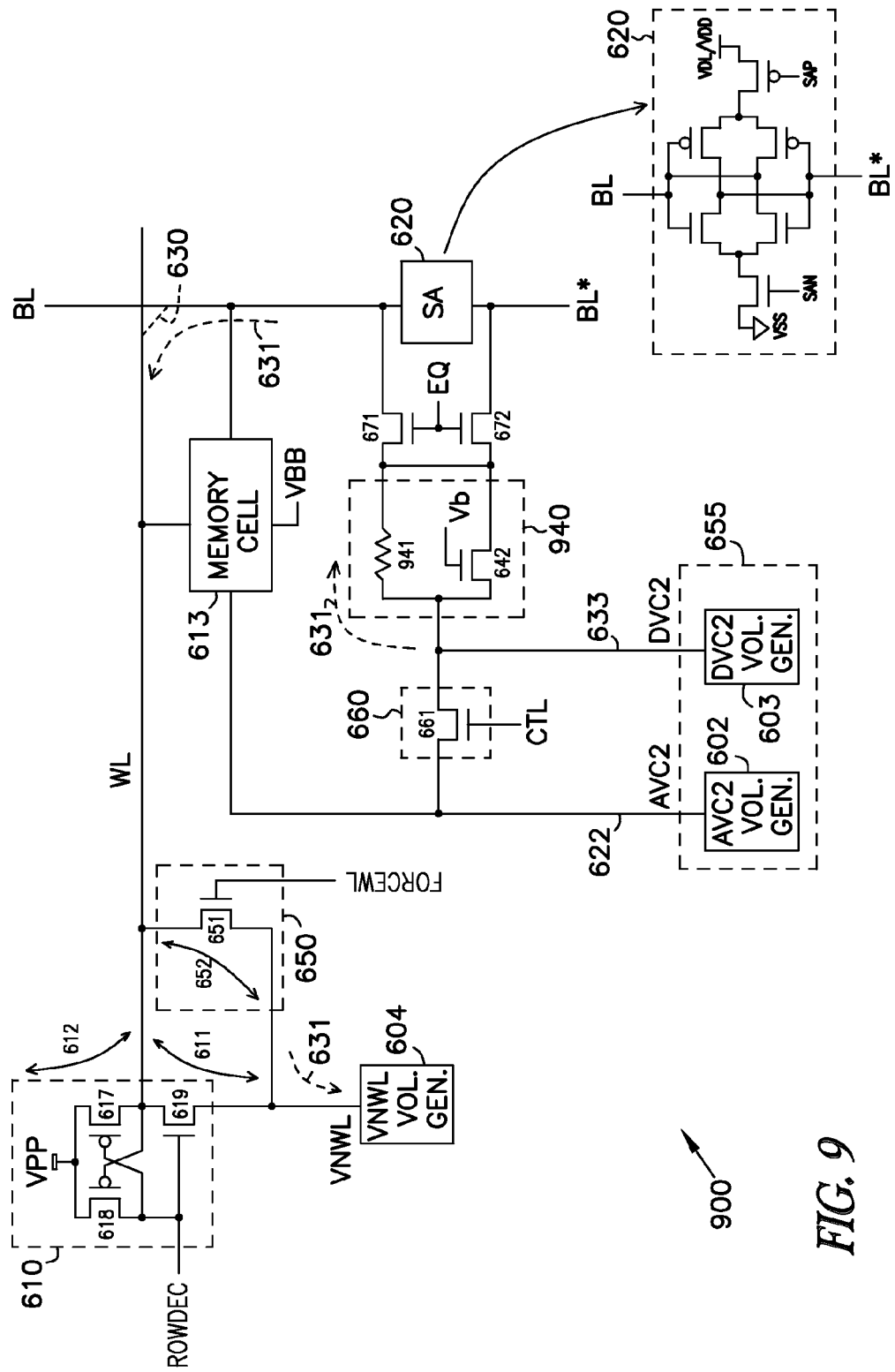
FIG. 9 shows a partial schematic diagram of a memory device including bleeder circuit with a resistor according to an embodiment of the invention.

FIG. 9 shows a partial schematic diagram of a memory device 900 including bleeder circuit 940 with resistor 941 according to an embodiment of the invention. Memory device 900 may include components similar or identical to memory device 600 of FIG. 6 or memory device 800 of FIG. 8, except for bleeder circuit 940 of FIG. 9. Similar or identical components between FIG. 6 and FIG. 9 are labeled with the same reference numbers. In FIG. 9, bleeder circuit 940 may include resistor 941 instead of a transistor such as n-channel transistor 641 of FIG. 6, or p-channel transistor 841 of FIG. 8. Bleeder circuit 940 may operate to reduce a short circuit current in a way similar or identical to that of bleeder circuit of FIG. 6 or FIG. 8. The resistance value of resistor may have a range of about 10 kilo-ohms to about one mega-ohm. A lower resistance value (e.g., from about 10 kilo-ohms to about 500 kilo-ohms) of resistor 941 may provide a higher performance in memory functionality (e.g., read, write, and refresh operation) of memory device 900 but may provide a lower reduction in the amount of the short circuit current in a standby mode. In the alternative, a higher resistance value (e.g., from between about 500 kilo-ohms to about one mega-ohms) for resistor 941 may provide higher reduction in the amount of the short circuit current in a standby mode, along with increased instability and lower performance. Further, using a resistor, such as resistor 941, to reduce the short circuit current in a standby mode may lower the number of circuit connections and signals such as the connections (e.g., Va or Vc) at the gate of transistors 641 or 841 (FIG. 6 or FIG. 8). Device size may be relatively smaller when a resistor such as resistor 941 (instead of a transistor) is used. Moreover, a resistor such as resistor 941 (instead of a transistor) may simplify the manufacturing process.

Figure 10:
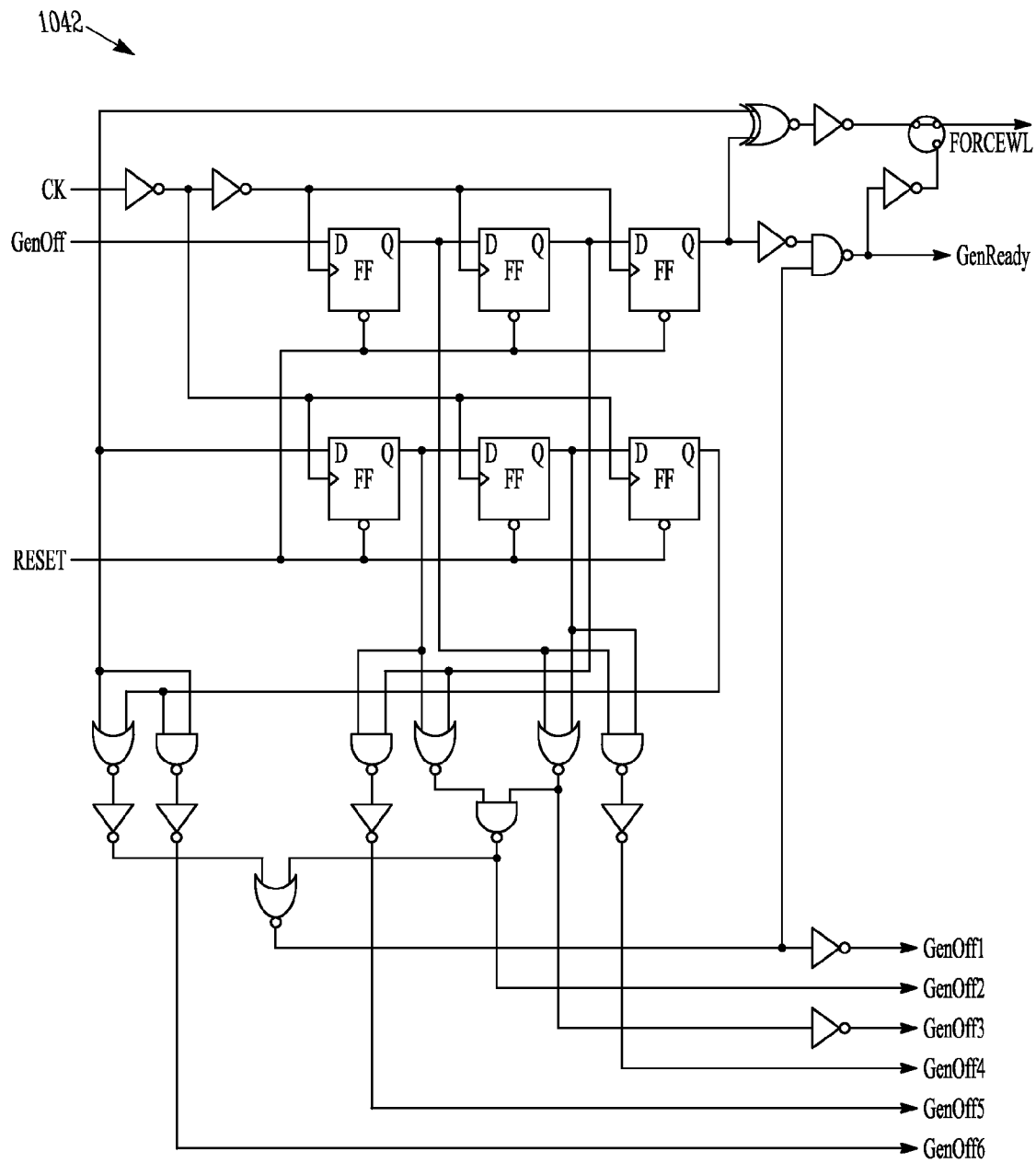
FIG. 10 shows a schematic diagram of a power controller according to an embodiment of the invention.

FIG. 10 shows a schematic diagram of a power controller 1042 according to an embodiment of the invention. Power controller 1042 may be substituted for power controller 142 of FIG. 1 and power controller 242 of FIG. 2. As shown in FIG. 10, power controller 1042 may respond to a clock signal CK and GenOff (similar or identical to those of FIG. 1) to generate signals GenOff1, GenOff2, GenOff3, GenOff4, GenOff5, and GenOff6, which may be used to inhibit generations of voltages such as voltages VPP, AVC2, DVC2, VNWL, VBB, VDL, and Vperi of memory device 100 of FIG. 1 and memory device 200 of FIG. 2. A reset signal RESET may be used to reset power controller 1042. A signal Gen-Ready may allow a refresh control circuit, such as refresh control circuit 122 of FIG. 1, to perform a refresh operation in a standby mode. A signal FORCEWL generated by power controller 1042 may be used to control a circuit such as circuits 250 and 650 (see FIG. 2 and FIG. 6) to couple a wordline to a VNWL voltage generator (e.g., VNWL voltage generator 204 or 604, of FIG. 2 or FIG. 6, respectively) when a voltage such as voltage VPP is reduced to a ground potential during a standby mode (as described with reference to FIG. 2 and FIG. 6).

Figure 11:
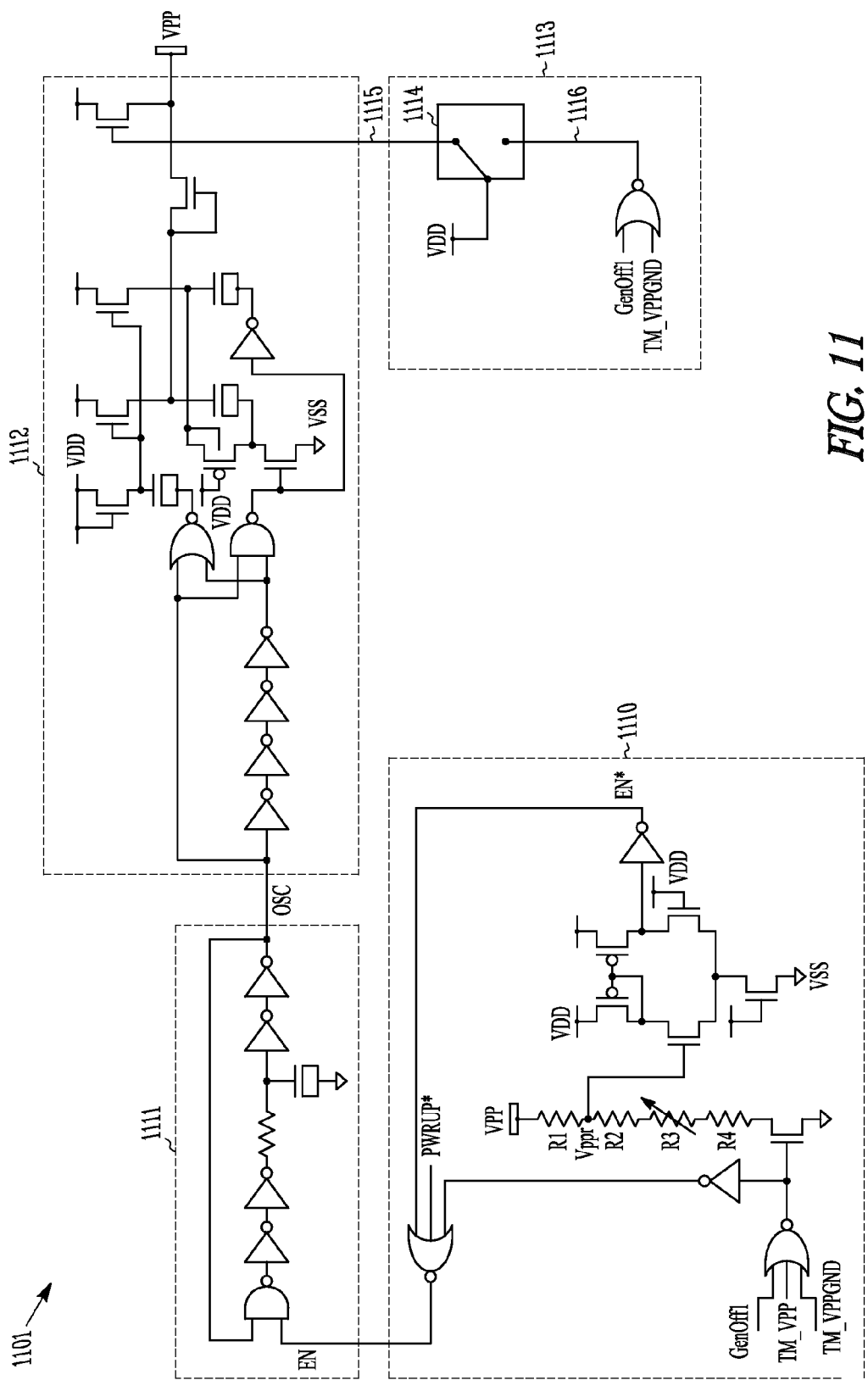
FIG. 11 shows a schematic diagram of a voltage generator to generate a positive wordline voltage according to an embodiment of the invention.

FIG. 11 shows a schematic diagram of a voltage generator 1101 to generate a positive wordline voltage VPP according to an embodiment of the invention. Voltage generator 1101 may be substituted for voltage generator 201 of FIG. 2. In FIG. 11, voltage generator 1101 may include a control circuit 1110, oscillator 1111, and a charge pump circuit 1112. Values of resistors R1, R2, R3, and R4 of control circuit 1110 may be selected such that a voltage value of voltage Vppr may be chosen (e.g., approximately 3.2 volts). Control circuit 1110 may generate a signal EN to control the oscillation of a signal OSC of oscillator 1111. When VPP is lower than Vppr, the EN signal has a high signal level, causing the OSC signal to oscillate. When VPP is higher than Vppr, the EN signal has a low signal level, causing the OSC signal to stop oscillating. Voltage generator 1101 may generate voltage VPP, which has a value higher than supply voltage VDD, by adding the OSC signal of oscillator 1111 in the positive voltage direction by charge pump circuit 1112 for rectification. The Voltage VPP at an output of charge pump circuit 1112 is fed back to control circuit 1110 to oscillate or stop oscillator 1111 in accordance with the value of voltage VPP, thereby controlling voltage VPP to be at a relatively constant value.

In FIG. 11, a GenOff1 signal may be provided by a power controller such as power controller 142 or 242 (FIG. 1 or FIG. 2). The waveform of voltage VPP may be similar or identical to the waveform of voltage VPP shown in FIG. 3 and FIG. 4. For example, in FIG. 11, when the GenOff1 signal has a low signal level, voltage VPP has a value (e.g., approximately 3.2 volts) higher than that (e.g., approximately 1.4 volts) of VDD. When the GenOff1 signal has a high signal level, voltage VPP has a value (e.g., approximately 1.4 volts) lower than that (e.g., approximately 1.4 volts) of VDD.

Voltage generator 1101 of FIG. 11 may include a circuit 1113 with a switch 1114. As shown in FIG. 11, switch 1114 is in a first position such that node 1115 is decoupled from node 1116. Thus, when the GenOff1 signal has a high signal level (e.g., in a standby mode), the value of voltage VPP may be reduced to a value of VDD minus a transistor threshold voltage Vt (e.g., in FIG. 4, VPP=VX=VDD−Vt, where VX is greater than approximately zero volts). In some embodiments, switch 1114 may be in a second position such that node 1115 is coupled to node 1116. In these embodiments, when the GenOff 1 signal has a high signal level (e.g., in a standby mode), the value of voltage VPP may be reduced to approximately ground potential (e.g., in FIG. 4 VPP=VX=0).

As shown in FIG. 11, VPP voltage generator 1101 may also receive test mode signals TM_VPP and TM_VPPGND to test VPP voltage generator 1101 for the values of voltage VPP during a test. For example, the signals TM_VPP and TM_VP-PGND may be activated in a manner similar or identical to that of the GenOff1 signal to observe waveform of VPP voltage during a test. The test may be performed in a standby mode of a memory device (e.g., memory device 100, 200, or 600 of FIG. 1, FIG. 2, or FIG. 6, respectively) where voltage generator 1101 may reside.

Figure 12:
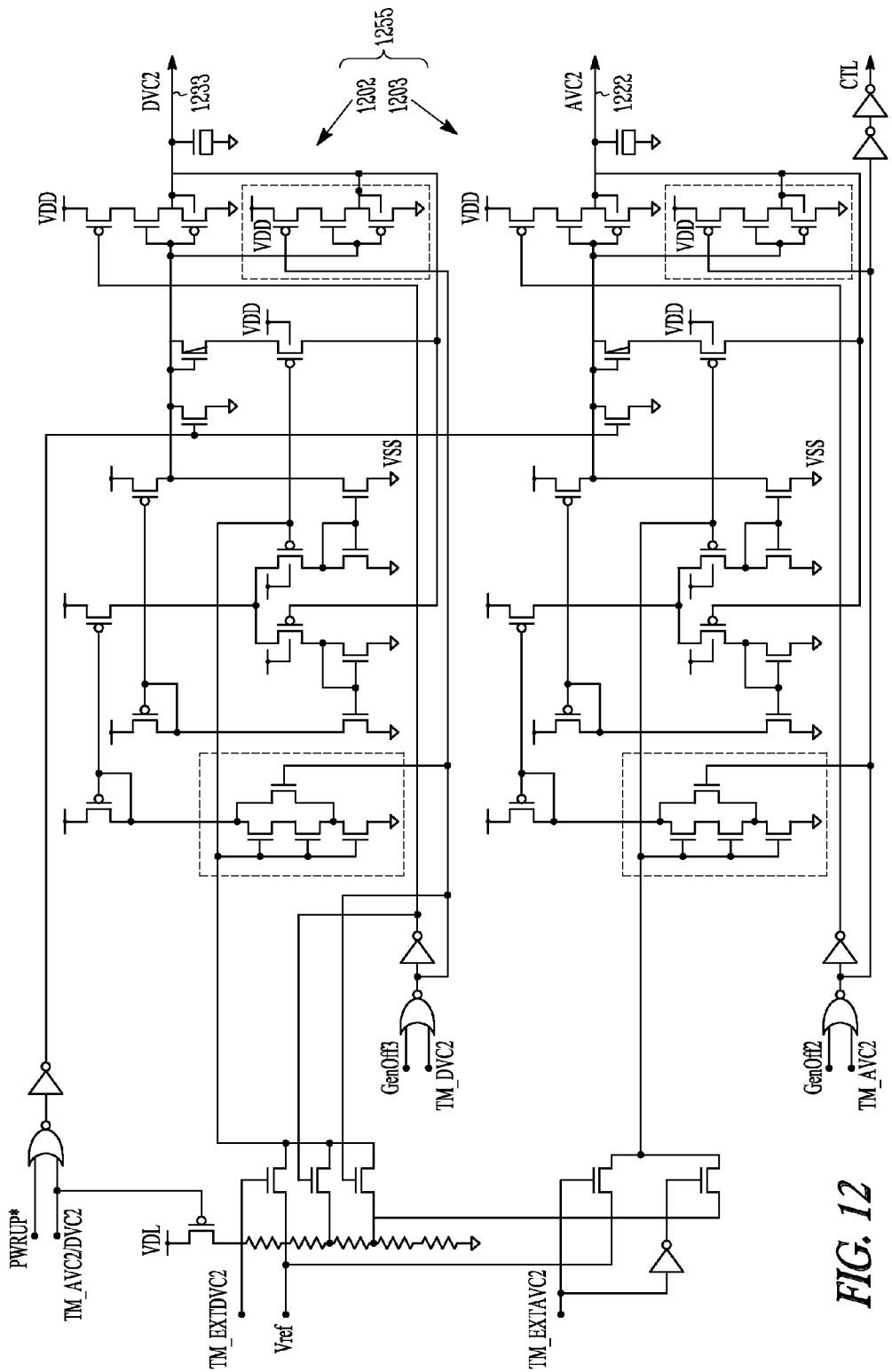
FIG. 12 shows a schematic diagram of a circuit having a voltage generator to generate a plate voltage and voltage generator to generate a precharge voltage according to an embodiment of the invention.

FIG. 12 shows a schematic diagram of a circuit 1255 having voltage generator 1202 to generate a plate voltage AVC2 and voltage generator 1203 to generate a precharge voltage DVC2 according to an embodiment of the invention. Circuit 1255 may be substituted for circuit 255 and 655 (see FIG. 2 and FIG. 6). In FIG. 12 circuit 1255 may receive a reference voltage Vref to generate voltages AVC2 and DVC2. Vref may be provided by a reference circuit such as reference circuit 139 of FIG. 1. In FIG. 12, GenOff2 and GenOff3 signals may be provided by a power controller such as power controller 142 or 242 (see FIG. 1 or FIG. 2). The waveforms of voltages AVC2 at an output node 1222 and DVC2 at an output node 1233 may be similar or identical to the waveforms of voltages AVC2 and DVC2 shown in FIG. 4. For example, in FIG. 12, when the GenOff2 and GenOff3 signals have the same signal levels (e.g. low), the values of voltages AVC2 and DVC2 may be equal to an initial voltage (e.g., V4 in FIG. 4). When the GenOff2 signal has a high signal level, the value of voltage AVC2 may decrease and become lower than the initial voltage (e.g., V3 in FIG. 4). When the GenOff3 signal has a high signal level, the value of voltage DVC2 may increase and become higher than the initial voltage (e.g., V5 in FIG. 4).

As shown in FIG. 12, circuit 1255 may generate a signal CTL, which may be used to control an isolation circuit, such as isolation circuit 260 or 660 (see FIG. 2 or FIG. 6), to isolate output node 1222 from output node 1233 after a refresh operation of a memory device, such as memory device 100, 200, or 600 (see FIG. 1, FIG. 2, or FIG. 6).

As shown in FIG. 12, circuit 1255 may also receives test mode signals TM_AVC2/DVC2, TM_EXTAVC2, TM_AVC2, TM_EXTDVC2, and TM_DVC2 to test circuit for the values of voltages AVC2 and DVC2 during a test. For example, the signals TM_AVC2 and TM_DVC2 may be activated in a manner similar or identical to that of the GenOff2 and GenOff3, respectively, to observe waveforms of voltages AVC2 and DVC2 during a test. The test may be performed in a standby mode of a memory device (e.g., see memory device 100, 200, or 600 of FIG. 1, FIG. 2, or FIG. 6) where circuit 1255 may reside.

Figure 13:
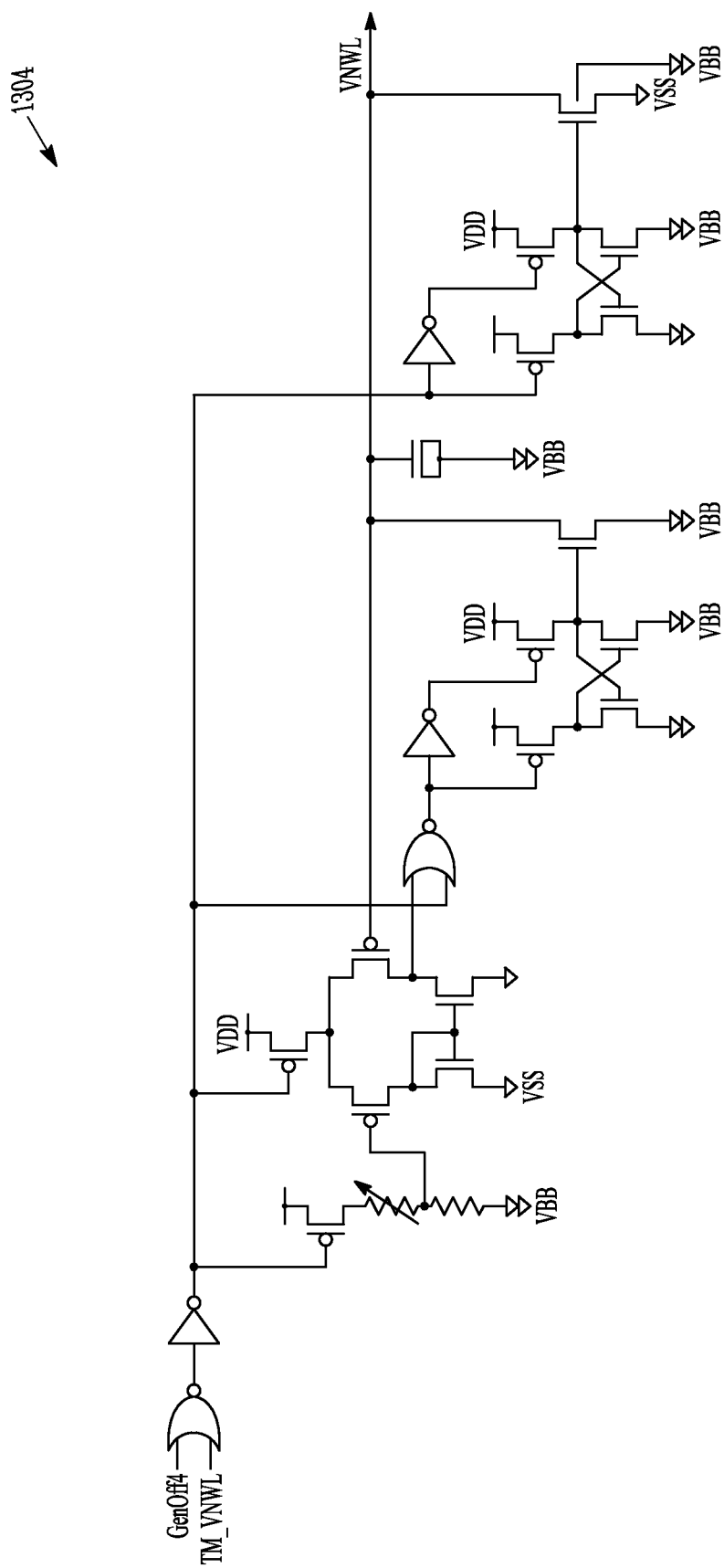
FIG. 13 shows a schematic diagram of a voltage generator to generate a negative wordline voltage according to an embodiment of the invention.

FIG. 13 shows a schematic diagram of a voltage generator 1304 to generate a negative wordline voltage VNWL according to an embodiment of the invention. Voltage generator 1304 may be substituted for voltage generator 204 and 604 (see FIG. 2 and FIG. 6). In FIG. 13, a GenOff4 signal may be provided by a power controller such as power controller 142 or 242 (see FIG. 1 or FIG. 2). The waveform of voltage VNWL may be similar or identical to the waveform of voltage VNWL shown in FIG. 3 and FIG. 4. For example, in FIG. 13, when the GenOff4 signal has a low signal level, voltage VNWL may have a first value (e.g., approximately −0.3 volts). When the GenOff4 signal has a high signal level, voltage VNWL may increase to a second value (e.g., approximately zero volts) higher than the first value.

As shown in FIG. 13, VNWL voltage generator 1304 may also receive a test mode signal TM_VNWL to test VNWL voltage generator 1304 for the values of voltage VNWL during a test. For example, the signal TM_VNWL may be activated in a manner similar or identical to that of the GenOff4 signal to observe the waveform of VNWL voltage during a test. The test may be performed in a standby mode of a memory device (e.g., see memory device 100, 200, or 600 of FIG. 1, FIG. 2, or FIG. 6) where voltage generator 1304 may reside.

Figure 14:
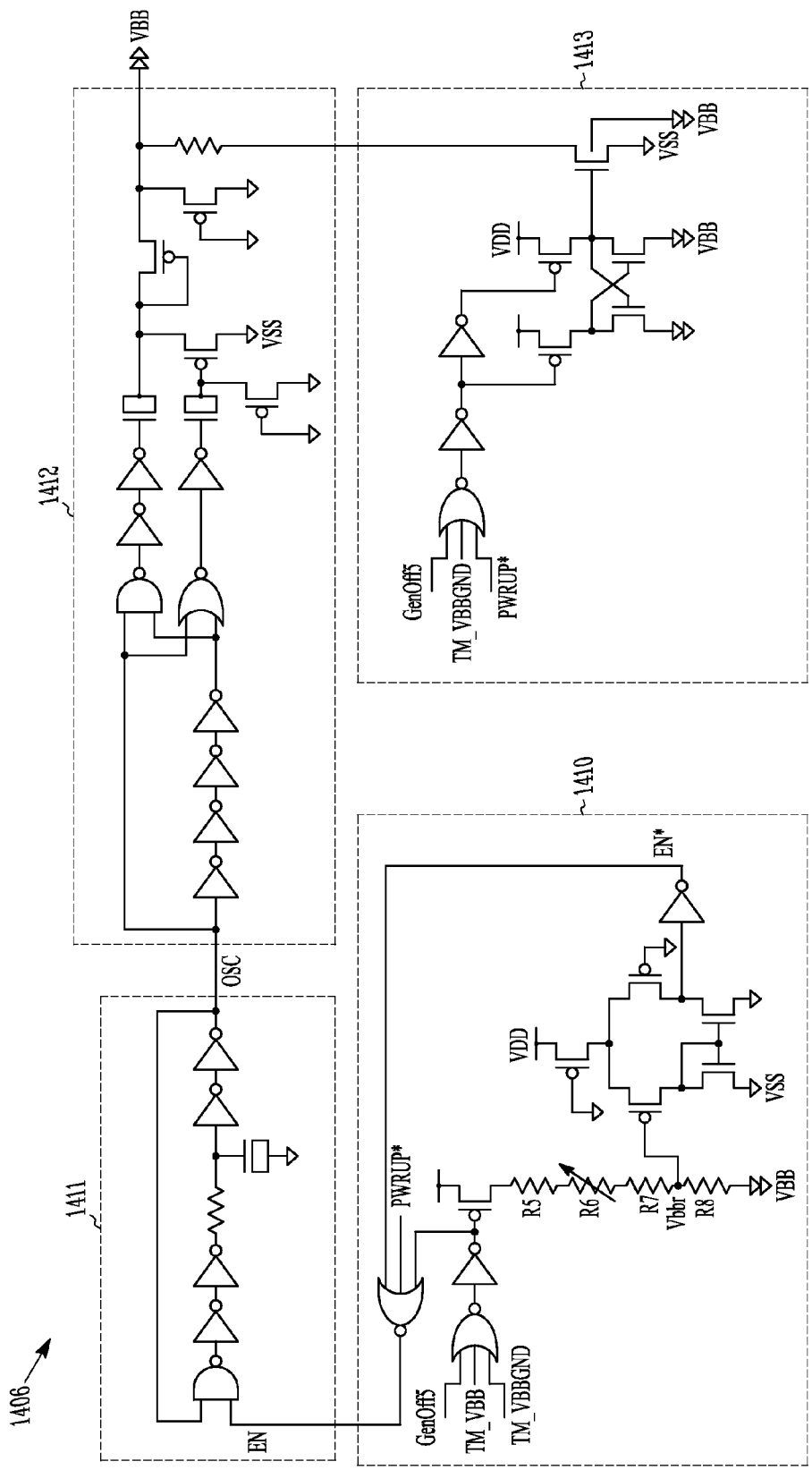
FIG. 14 shows a schematic diagram of a voltage generator to generate a negative substrate voltage according to an embodiment of the invention.

FIG. 14 shows a schematic diagram of a voltage generator 1406 to generate a negative substrate voltage VBB according to an embodiment of the invention. Voltage generator 1406 may substitute voltage generator 206 of FIG. 2. In FIG. 14, voltage generator 1406 may include a control circuit 1410, oscillator 1411, and a charge pump circuit 1412. Value of resistors R5, R6, R7, and R8 of control circuit 1410 may be selected such that a voltage value of voltage Vbbr may be chosen (e.g., approximately −0.5 volts). Voltage generator 1406 may operate in a fashion that differs from that of voltage generator 1101 of FIG. 11. For example, in FIG. 14, control circuit 1410 may generate a signal EN to control the oscillation of a signal OSC of oscillator 1411. When VBB is higher than Vbbr, the EN signal has a high signal level, causing the OSC signal to oscillate. When VBB is lower than Vbbr, the EN signal has a low signal level, causing the signal OSC to stop oscillating. Voltage generator 1406 may generate voltage VBB, which has a value higher than supply voltage VDD, by adding the OSC signal of oscillator 1411 in the negative voltage direction by charge pump circuit 1412 for rectification. The Voltage VBB at an output of charge pump circuit 1412 is fed back to control circuit 1410 to oscillate or stop oscillator 1411 in accordance with the value of voltage VBB, thereby controlling voltage VBB to be at a relatively constant value.

In FIG. 14, a GenOff5 signal may be provided by a power controller such as power controller 142 or 242 (see FIG. 1 or FIG. 2). The waveform of voltage VBB may be similar or identical to the waveform of voltage VBB shown in FIG. 3 and FIG. 4. For example, in FIG. 14, when the GenOff5 signal has a low signal level, voltage VBB may have a first value (e.g., approximately −0.5 volts). When the GenOff5 signal has a high signal level, voltage VBB may increase to a second value (e.g., approximately zero volts) higher than the first value. Voltage generator 1406 of FIG. 14 may include a circuit 1413 to allow voltage VBB to go to zero volts when the GenOff5 signal has a high signal level.

As shown in FIG. 14, VBB voltage generator 1410 may also receive test mode signals TM_VBB and TM_VBBGND to test VBB voltage generator 1410 for the values of voltage VBB during a test. For example, the signals TM_VBB and TM_VBBGND may be activated in a manner similar or identical to that of the GenOff5 signal to observe the waveform of VBB voltage during a test. The test may be performed in a standby mode of a memory device (e.g., see memory device 100, 200, or 600 of FIG. 1, FIG. 2, or FIG. 6) where voltage generator 1410 may reside.

Figure 15:
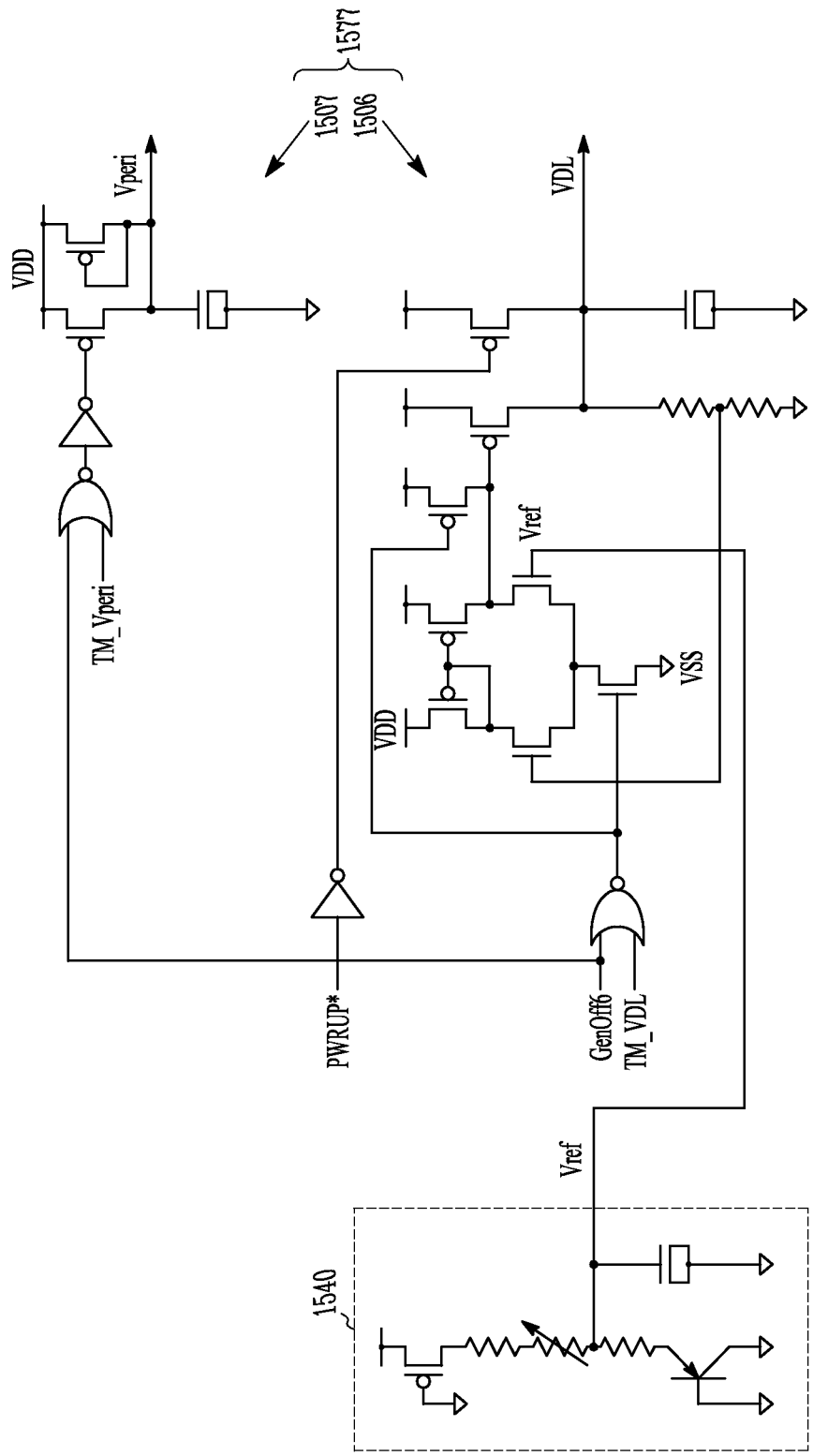
FIG. 15 shows a schematic diagram of a circuit including a voltage generator to generate a bit line voltage and a voltage generator to generate a peripheral voltage according to an embodiment of the invention.

FIG. 15 shows a schematic diagram of a circuit 1577 including a voltage generator 1506 to generate a bit line voltage VDL and a voltage generator 1507 to generate a peripheral voltage Vperi according to an embodiment of the invention. Circuit 1577 may substitute circuit 255 and 655 (see FIG. 2 and FIG. 6). In FIG. 15 circuit 1577 may receive a reference voltage Vref from an internal reference voltage 1540 to generate voltages VDL and Vperi. A GenOff6 signal may be provided by a power controller such as power controller 142 or 242 (see FIG. 1 or FIG. 2). The waveforms of voltages VDL and Vperi may be similar or identical to the waveforms of voltages VDL and Vperi shown in FIG. 4. For example, in FIG. 15, when the GenOff6 signal has a low signal level, voltages VDL and Vperi may have first values (e.g., see V6 and V7, respectively, in FIG. 4). When the GenOff6 signal has a high signal level, the values of voltages VDL and Vperi may decrease and become lower than the their respective first voltages (e.g., approximately zero volts and VY in FIG. 4).

As shown in FIG. 15, circuit 1577 may also receive test mode signals TM_VDL and TM_Vperi to test circuit 1577 for the values of voltages VDL and Vperi during a test. For example, the signals TM_VDL and TM_Vperi may be activated in a manner similar or identical to that of the GenOff6, to observe waveforms of voltages VDL and Vperi during a test. The test may be performed in a standby mode of a memory device (e.g., see memory device 100, 200, or 600 of FIG. 1, FIG. 2, or FIG. 6) where circuit 1577 may reside.

Figure 16:
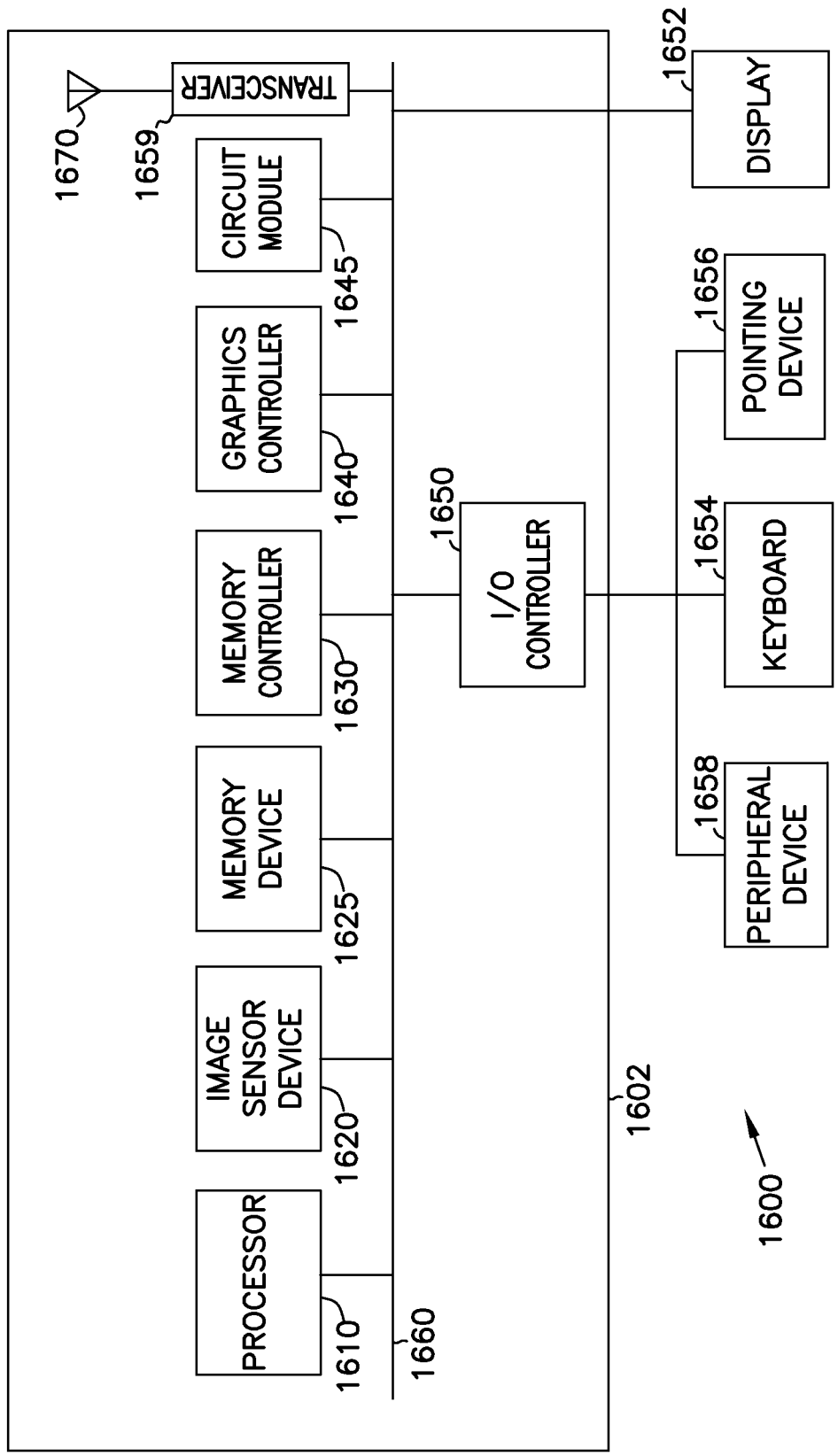
FIG. 16 shows a system according to an embodiment of the invention.

FIG. 16 shows a system 1600 according to an embodiment of the invention. System 1600 may include a processor 1610, an image sensor device 1620, a memory device 1625, a memory controller 1630, a graphics controller 1640, a circuit module 1645, an input and output (I/O) controller 1650, a display 1652, a keyboard 1654, a pointing device 1656, a peripheral device 1658, a transceiver 1659, a bus 1660 to transfer information among the components of system 1600, and an antenna 1670 to wirelessly transmit and receive information to and from system 1600. Transceiver 1659 may operate to transfer information from one or more the components of system 1600 (e.g., at least one of processor 1610 and memory device 1625) to antenna 1670. Transceiver 1659 may also operate to transfer information received at antenna 1670 to at least one of the processor 1610 and a memory device 1625, such as a flash memory device. The information received at antenna 1670 may be transmitted to system 1600 by a source (not shown) external to system 1600. System 1600 may also include a circuit board 1602 on which some components of system 1600 may be located. In some embodiments, the number of components of system 1600 may vary. For example, in some embodiments, system 1600 may omit one or more of display 1652, image sensor device 1620, memory device 1625, and circuit module 1645.

Processor 1610 may include a general-purpose processor or an application specific integrated circuit (ASIC). Processor 1610 may include a single core processor or a multiple-core processor. Processor 1610 may execute one or more programming commands to process information. The information may include digital output information provided by other components of system 1600, such as by image sensor device 1620 or memory device 1625.

Image sensor device 1620 may include a complementary metal-oxide-semiconductor (CMOS) image sensor having a CMOS pixel array or charge-coupled device (CCD) image sensor having a CCD pixel array.

Memory device 1625 may include a volatile memory device, a non-volatile memory device, or a combination of both. For example, memory device 1625 may include a DRAM device, a static random access memory (SRAM) device, a flash memory device, or a combination of these memory devices. In some embodiments, memory device 1625 may include one or more embodiments of the invention, as shown and described with respect to FIG. 1 through FIG. 15 (e.g., memory devices 100, 200, and 600).

Display 1652 may include an analog display or a digital display. Display 1652 may receive information from other components. For example, display 1652 may receive information that is processed by one or more of image sensor device 1620, memory device 1625, graphics controller 1640, and processor 1610 to display information such as text or images.

Circuit module 1645 may include a circuit module of a vehicle. Circuit module 1645 may receive information from other components to activate one or more subsystems of the vehicle. For example, circuit module 1645 may receive information that is processed by one or more of image sensor device 1620, memory device 1625, and processor 1610, to activate one or more of an air bag system of a vehicle, a vehicle security alarm, and an obstacle alert system.

The illustrations of apparatus such as memory devices 100, 200, and 600 and systems such as embodiments of system 1600 are intended to provide a general understanding of the structure of various embodiments, and not as a complete description of all the elements and features of apparatus and systems that might make use of the structures described herein. In the description above, signals noted as being in a high (high signal level or high state) or low (low signal level or low state) are described in that matter for purposes of illustration and not limitation. Other states, including opposite states, may be used.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 17:
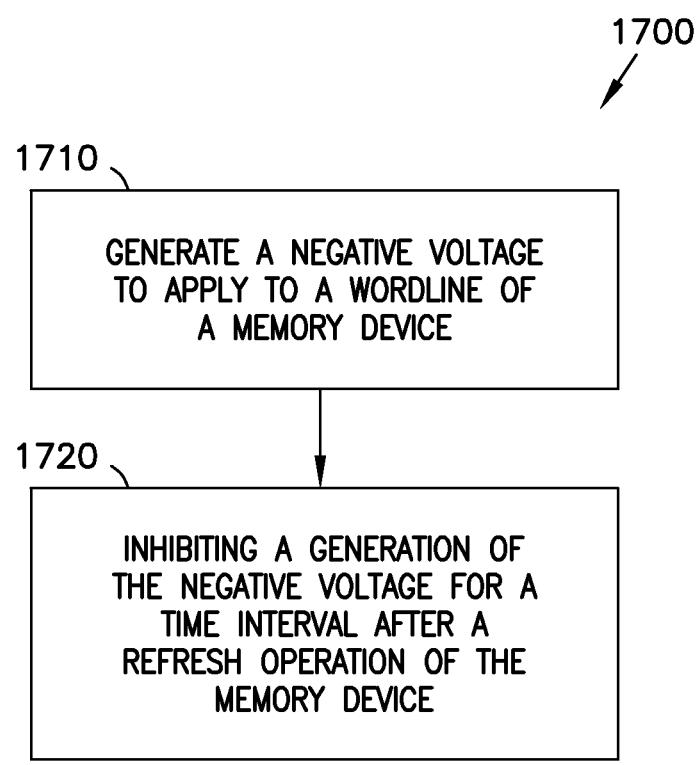
FIG. 17 is a flow diagram showing a method according to an embodiment of the invention

FIG. 17 is a method 1700 according to an embodiment of the invention. Activity 1710 may include generating a negative wordline voltage to apply to a wordline of a memory device. The memory device in method 1700 may include memory device 100, 200, and 600 including a negative wordline voltage such as voltage VNWL, as described above with reference to FIG. 1 through FIG. 16.

Activity 1720 of method 1700 in FIG. 17 may include inhibiting a generation of the negative wordline voltage during a time interval after a refresh operation of the memory device. The refresh operation in activity 1720 may include refresh operations in the memory device which occur during a standby mode such as refresh operations 301, 304, and 307 (FIG. 3) and refresh operations 401 and 402 (FIG. 4). Method 1700 may include any one or more activities and operations of a memory device described above with reference to FIG. 1 through FIG. 16.

CONCLUSION

Various embodiments described herein include apparatus, systems, and methods comprising a first voltage generator to generate a voltage to apply to a line used to access a memory cell of a memory device in which the voltage is applied to the line when the memory cell is not being accessed, and a power controller to cause the voltage to change during a time interval after a refresh operation of the memory device. Other embodiments including additional apparatus, systems, and methods are described above with reference to FIG. 1 through FIG. 17.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
   a first voltage generator to generate a first voltage to apply to a line used to access a memory cell of a memory device, wherein the first voltage is applied to the line used to access the memory cell when the memory cell is not being accessed;
   a second voltage generator to generate a second voltage to apply to the line used to access the memory cell when the memory cell is being accessed;
   a third voltage generator to generate a third voltage to apply to a line used to transfer data with the memory cell, wherein the line used to transfer data with the memory cell includes a bit line;

a driver to selectively apply at least one of the first and second voltages to the line used to access the memory cell;

a power controller to cause the first voltage generator to increase a value of the first voltage during a time interval after a refresh operation of the memory device, to cause the second voltage generator to reduce a value of the second voltage during the time interval after the refresh operation, and to cause the third voltage generator to increase a value of the third voltage after the refresh operation from a first positive value during the refresh operation to a second positive value immediately after the refresh operation; and a fourth voltage generator to generate a fourth voltage to apply to a substrate of the memory device, wherein the power controller causes the fourth voltage generator to increase a value of the fourth voltage during the time interval after the refresh operation.

2. The apparatus of claim 1 comprising:
a fifth voltage generator to generate a fifth voltage to apply to a storage node of a memory cell of the memory device, wherein the power controller causes the fifth voltage generator to decrease a value of the fifth voltage during the time interval after the refresh operation.

3. The apparatus of claim 1 comprising:
a fifth voltage generator to generate a fifth voltage to supply a peripheral circuit of the memory device, wherein the power controller causes the fifth voltage generator to reduce a value of the fifth voltage during the time interval after the refresh operation.

4. The apparatus of claim 1 comprising:
a fifth voltage generator to generate a fifth voltage to supply a sense amplifier of the memory device, wherein the power controller causes the fifth voltage generator to reduce a value of the fifth voltage during the time interval after the refresh operation.

5. The apparatus of claim 1, wherein the first voltage generator is to increase the value of the first voltage to approximately a ground potential.

6. The apparatus of claim 5, wherein the second voltage generator is to reduce the value of the second voltage to approximately a ground potential.

7. The apparatus of claim 6, wherein the fourth voltage generator is to increase the value of the fourth voltage to approximately a ground potential.

8. An apparatus comprising:
a first voltage generator to generate a first voltage to apply to a line used to access a memory cell of a memory device, wherein the first voltage is applied to the line used to access the memory cell when the memory cell is not being accessed;

a second voltage generator to generate a second voltage to apply to the line used to access the memory cell when the memory cell is being accessed;

a third voltage generator to generate a third voltage to apply to a line used to transfer data with the memory cell, wherein the line used to transfer data with the memory cell includes a bit line;

a driver to selectively apply at least one of the first and second voltages to the line used to access the memory cell; and a power controller to cause the first voltage generator to increase a value of the first voltage during a time interval after a refresh operation of the memory device, to cause the second voltage generator to reduce a value of the second voltage during the time interval after the refresh operation, and to cause the third voltage generator to increase a value of the third voltage from a first positive value during the refresh operation to a second positive value immediately after the refresh operation, wherein the second voltage generator comprises an output node to provide the second voltage, and a circuit to couple the output node to a ground potential during the time interval after the refresh operation.

9. A method comprising:
generating a first voltage to apply to a line used to access a memory cell of a memory device, wherein the first voltage is applied to the line when the memory cell is not being accessed;

changing the first voltage during a time interval after a refresh operation of the memory device;

generating a second voltage to apply to a line used to transfer data with the memory cell of a memory device;

increasing a value of the second voltage after the refresh operation;

generating a third voltage to apply to a substrate of the memory device;

inhibiting the generating of the third voltage during the time interval after the refresh operation generating a fifth voltage to apply to a storage node of the memory cell;

generating a sixth voltage to apply to a line used to transfer data with the memory cell; and increasing a value of the sixth voltage to be higher than a value of the fifth voltage during the time interval after the refresh operation.

10. The method of claim 9 comprising:
generating a seven voltage for supplying a peripheral circuit of the memory device; and reducing a value of the seven voltage during the time interval after the refresh operation.

11. The method of claim 10, wherein the value of the seven voltage is reduced to a value lower than a value of a supply voltage supplied to the memory device and higher than approximately the ground potential.

12. The method of claim 11, wherein the value of the sixth voltage is reduced to approximately the ground potential.

13. The method of claim 9, wherein the method is performed in a sequential order of reducing the value of the second voltage, increasing the value of the sixth voltage, increasing the value of the first voltage, increasing the value of the fourth voltage, and reducing the value of the seven voltage.

14. The method of claim 13 comprising:
performing a power recovery operation after the refresh operation and before an additional refresh operation, wherein the power recovery operation is performed in an order reversed from the sequential order.

* * * * *